(12) United States Patent
Iwasaki

(10) Patent No.: US 6,625,058 B2
(45) Date of Patent: Sep. 23, 2003

(54) METHOD FOR MAGNETIC CHARACTERISTICS MODULATION AND MAGNETICALLY FUNCTIONING APPARATUS

(75) Inventor: Yoh Iwasaki, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/171,759

(22) Filed: Jun. 14, 2002

(65) Prior Publication Data

US 2003/0012050 A1 Jan. 16, 2003

(30) Foreign Application Priority Data

Jun. 20, 2001 (JP) ....................... P2001-186045

(51) Int. Cl.[7] .............................................. G11C 11/14
(52) U.S. Cl. ........................ 365/171; 365/158; 365/173
(58) Field of Search ................................ 365/171, 158, 365/173

(56) References Cited

U.S. PATENT DOCUMENTS 5,587,943 A * 12/1996 Torok et al. ............... 365/158
5,958,611 A * 9/1999 Ohta et al. ................. 428/692
5,966,322 A * 10/1999 Pohm et al. ............... 365/158

* cited by examiner

Primary Examiner—Richard Elms
Assistant Examiner—Tuan T. Nguyen
(74) Attorney, Agent, or Firm—Sonnenschein, Nath & Rosenthal

(57) ABSTRACT

A method of modulating magnetic properties of a magnetic film, and new magnetic devices that utilizes the method are set forth. The method works in a multi-layer structure consisting of two layers of low electrical resistivity separated by a spacer layer with higher resistivity, wherein at least one of the layers is magnetic. The modulation of magnetic properties is executed by applying an external voltage to the multi-layer. An electric field induced in the multi-layer by the voltage changes electronic states near the interface between layers, which leads to a modification of either of the following magnetic properties: interface magnetic anisotropy, interface magnetostriction, or inter-layer magnetic coupling. The modulation of the magnetic properties thus performed deflects or rotates magnetization vector in the magnetic film, which is utilized in device applications.

21 Claims, 17 Drawing Sheets

(1)

⬇ CHANGE BY VOLTAGE ON (2)

NONMAGNETIC ATOM

MAGNETIC LAYER (PLAN VIEW)

(SIDE VIEW)

(1)

(2)

*Prior Art*

METHOD FOR MAGNETIC CHARACTERISTICS MODULATION AND MAGNETICALLY FUNCTIONING APPARATUS

CROSS REFERENCES TO RELATED APPLICATIONS

The present document is based on Japanese Priority Document JP 2001-186045, filed in the Japanese Patent Office on Jun. 20, 2001, the entire contents of which being incorporated herein by reference.

BACKGROUND OF THE INVENTION

1. Field of the Invention

The present invention relates to a method for magnetic characteristics modulation and a magnetically functioning apparatus. More particularly, the present invention is concerned with a magnetic characteristics modulation method for changing the characteristics of a magnetic thin film by changing an electric field generated on the surface of the magnetic thin film, and a magnetically functioning apparatus.

2. Description of the Related Art

As an example of a magnetically functioning apparatus utilized in large scale integrated circuit (LSI), a magnetic random access memory (hereinafter, referred to simply as "MRAM") 101 diagrammatically shown in FIG. 30 has been known An MRAM is constituted by a bit line 111, a word line 121 disposed in a direction perpendicular to the bit line 111, and a magnetic memory device 131 provided between the bit line 111 and the word line 121 which cross to each other, and a tunnel magnetoresistance device is used in the magnetic memory device 131.

In the further scaled-down devices, the MRAM 101 suffers inversion of magnetization and therefore, the strength of a magnetic field generated by a current is reduced, that is, the strength of the magnetic field obtained is reduced substantially proportionally to the diameter of a conductor wire. Further, when the device size reaches a so-called deep submicron, writing to a thermally stable memory by such a magnetic field generated by a current is impossible. This situation is described with reference to FIG. 31.

In FIG. 31, a magnetic field is taken as the ordinate, and a conductor wire diameter is taken as the abscissa. The solid line indicates a magnetic field strength that can be created by flowing a current through a conductor wire on the assumption that a current density satisfies the relationship: i<5 MA/cm$^2$. The dotted line indicates a coercive force required when the magnetic storage is thermally stable, and the region on the right side of the dotted line is a thermally stable region and the region on the left side of the dotted line is a thermally unstable region.

The MRAM described above with reference to FIG. 30 has a feature such that writing is conducted using a magnetic field, and has an advantage in that the writing speed is high. However, when the structure of the MRAM is scaled down, the diameter of a conductor wire (for example, a bit line or a word line) used for generating a magnetic field must be reduced. As shown in FIG. 31, the smaller the diameter of a conductor wire, the smaller the strength of the magnetic field generated. That is, writing to a device having a high coercive force is difficult. On the other hand, as also shown in FIG. 31, in the magnetic memory device 131 (see FIG. 30) designed for a small conductor wire diameter, when it has no satisfactorily large coercive force and magnetic anisotropy, it is difficult to keep a magnetic storage against thermal fluctuation. For example, when the conductor wire diameter is about 0.1 μm, a magnetic field at about 50 Oe is required. This means that writing by a current is difficult.

For removing the above-mentioned problem in driving of the magnetization in a scaled-down device by a magnetic field, several proposals have been made.

One example of driving of magnetization by using heat is described with reference to the diagrammatic view of FIG. 32. As shown in FIG. 32, on a substrate 201, a $CoFe_2O_4$ layer 211, an Fe—Ag layer 212, and a $NiFe_2O_4$ layer 213 are stacked on one another, and a circuit 221 for applying a voltage to the Fe—Ag layer 212 through the $NiFe_2O_4$ layer 213 is provided. The circuit 221 has a construction such that a power source 222 and a switch 223 are connected to each other in series. When a voltage is applied by means of the circuit 221, the exchange coupling between a magnetic vector M in the $CoFe_2O_4$ layer 211 in one fixed direction indicated by the arrow shown in the figure and a magnetic vector of the $NiFe_2O_4$ layer 213 through the Fe—Ag layer 212 is broken, so that the magnetic vector of the $NiFe_2O_4$ layer 213 is rendered free. When no voltage is applied from the circuit 221, the magnetic vector of the $NiFe_2O_4$ layer 213 is affected so that the direction of its magnetic vector and the direction of the magnetic vector M of the $CoFe_2O_4$ layer 211 are the same.

Next, one example of a method for modulating the magnetic anisotropy by using a stress utilizing a magnetostrictive material is described with reference to the diagrammatic view of FIG. 33. As shown in FIG. 33, on an electrode layer 311, a piezoelectric layer 312 and a distortion-sensitive magnetic thin film (which functions also as an electrode) 313 are stacked on one another, and a circuit 321 for applying a voltage to between the distortion-sensitive magnetic thin film 313 and the electrode layer 311 is provided. The circuit 321 has a construction such that a power source 322 and a switch 323 are connected to each other in series. When a voltage is applied by means of the circuit 321, a magnetic vector M indicated by the arrow shown in the figure is generated in the distortion-sensitive magnetic thin film 313.

Next, one example of a method of driving the magnetization by using quantum interference in the multilayer structure is described with reference to the diagrammatic view of FIG. 34. As shown in FIG. 34, on a MgO substrate 401, a Cu under layer 411, a Co magnetic layer 412, a Cu intermediate layer 413, a Co magnetic layer 414, a Cu coating layer 415, a Ge coating layer 416, and a Cu electrode layer 417 are stacked on one another, and a circuit 421 for applying a voltage to between the Cu electrode layer 417 and the Cu coating layer 415 is provided. The circuit 421 has a construction such that a power source 422 and a switch 423 are connected to each other in series.

However, the construction shown in FIG. 32, in which driving of magnetization is conducted using heat, needs a practical method for forming a scaled-down structure which can realize inversion of opposite directions (N/S repeated inversion) of magnetization using only heat.

On the other hand, the construction shown in FIG. 33, in which the magnetic anisotropy is changed using a stress, has problems of integration in the growth of the piezoelectric layer 312 and the removal of fatigue caused by the stress from the material.

Further, the construction shown in FIG. 34, in which driving of magnetization is conducted using quantum interference in the multilayer structure, requires at least two magnetic layers for practical driving of magnetization, and, in this construction, modulation of the magnetization does not always occur only on the surface of the magnetic layer, leading to a necessity that the whole layer structure containing these layers must be formed with high precision.

SUMMARY OF THE INVENTION

The present invention provides a method of modulating magnetic properties of materials and a magnetically functioning apparatus for alleviating or solving the above-mentioned problems.

An embodiment of the present invention is a method of changing magnetization state of a magnetic thin film in a stacked multilayer structure comprising following layers: a first layer, a second layer having a higher electrical resistivity than that of the first layer, and a third layer having a lower electrical resistivity than that of the second layer. At least one of the three layers is a magnetic layer having an ordering of microscopic magnetic moments. The method comprises changing the magnetization state of the magnetic thin film by utilizing an effect wherein, when a voltage is applied between the first layer and the third layer by means of an external circuit, electronic state of the surface of the magnetic layer is changed. The change in the electronic state causes modification of either of the following properties: the magnetic anisotropy or magnetostriction of the magnetic layer or the magnetic coupling between the magnetic layer and an adjacent magnetic layer.

The modulation of the above magnetic properties thus obtained leads to deflection or rotation of magnetization vector in the magnetic film, which is utilized in device applications.

Another embodiment of the present invention is a device or apparatus comprising a stacked multi-layer structure comprising a first layer, a second layer having a higher electrical resistivity than that of the first layer, and a third layer having a lower electrical resistivity than that of the second layer. At least one of the above three individual layers is magnetic.

The magnetization vector in this apparatus is deflected or rotated as a consequence of a modulation of either of the following magnetic properties: magnetic anisotropy or magnetostriction of the magnetic layer or the magnetic coupling between the magnetic layer and an adjacent magnetic layer. This modulation of above magnetic properties is achieved by the change in electronic states near the surface or interface of the magnetic layer that is executed by an application of an external voltage to the multi-layer structure.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DETAILED DESCRIPTION OF THE PREFERRED EMBODIMENTS

A magnetic characteristics modulation method according to a first embodiment of the present invention will be described with reference to the diagrammatic view of FIG. 1.

Figure 1:
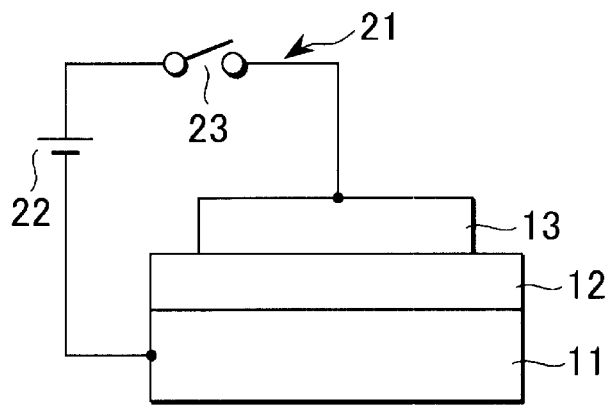
FIG. 1 is a diagrammatic view showing the construction of a magnetic characteristics modulation method according to the first embodiment of the present invention.

As shown in FIG. 1, a laminated structure in which a first layer 11 comprised of a low-resistance thin film, a second layer 12 having a higher electrical resistivity than that of the first layer 11, and a third layer 13 having a lower electrical resistivity than that of the second layer 12 are stacked on one another is used. At least one layer selected from the group consisting of the first layer 11, the second layer 12, and the third layer 13 comprises a magnetic layer comprised of a material exhibiting a magnetic property. An external circuit 21 is connected to both the first layer 11 and the third layer 13, and the external circuit 21 has a construction such that, for example, a power source 22 and a switch 23 are connected to each other in series. For example, the positive electrode in the power source 22 is connected to the first layer 11, and the negative electrode in the power source 22 is connected to the third layer 13.

In a laminated structure 10 having the above-mentioned construction, by utilizing an effect such that, when a voltage is applied to between the first layer 11 and the third layer 13 by means of the external circuit 21 to change the electron state of the surface of the magnetic layer, the change of the electron state causes the magnetic anisotropy or magnetostriction of the magnetic layer or the magnetic coupling between the magnetic layer and the adjacent magnetic layer to change, the magnetization state of a magnetic thin film is changed.

The modulation of magnetic characteristics is realized by generating a strong electric field on the surface of a magnetic thin film by means of the external circuit 21. For obtaining such an electric field, the structure shown in FIG. 1 is used in which a layer having a higher electric resistance, i.e., the second layer 12 is disposed between two layers each having a lower electric resistance, i.e., the first layer 11 and the third layer 13.

At least one layer of the layers in the laminated structure 10 comprises a magnetic layer. Explanation is made on the position(s) of the magnetic layer(s) (for which material is not limited to a ferromagnetic material but includes an antiferromagnetic material and a ferrimagnetic material since they have magnetic order) in the laminated structure 10 with reference to FIGS. 2(1) to 2(7).

Figure 2:
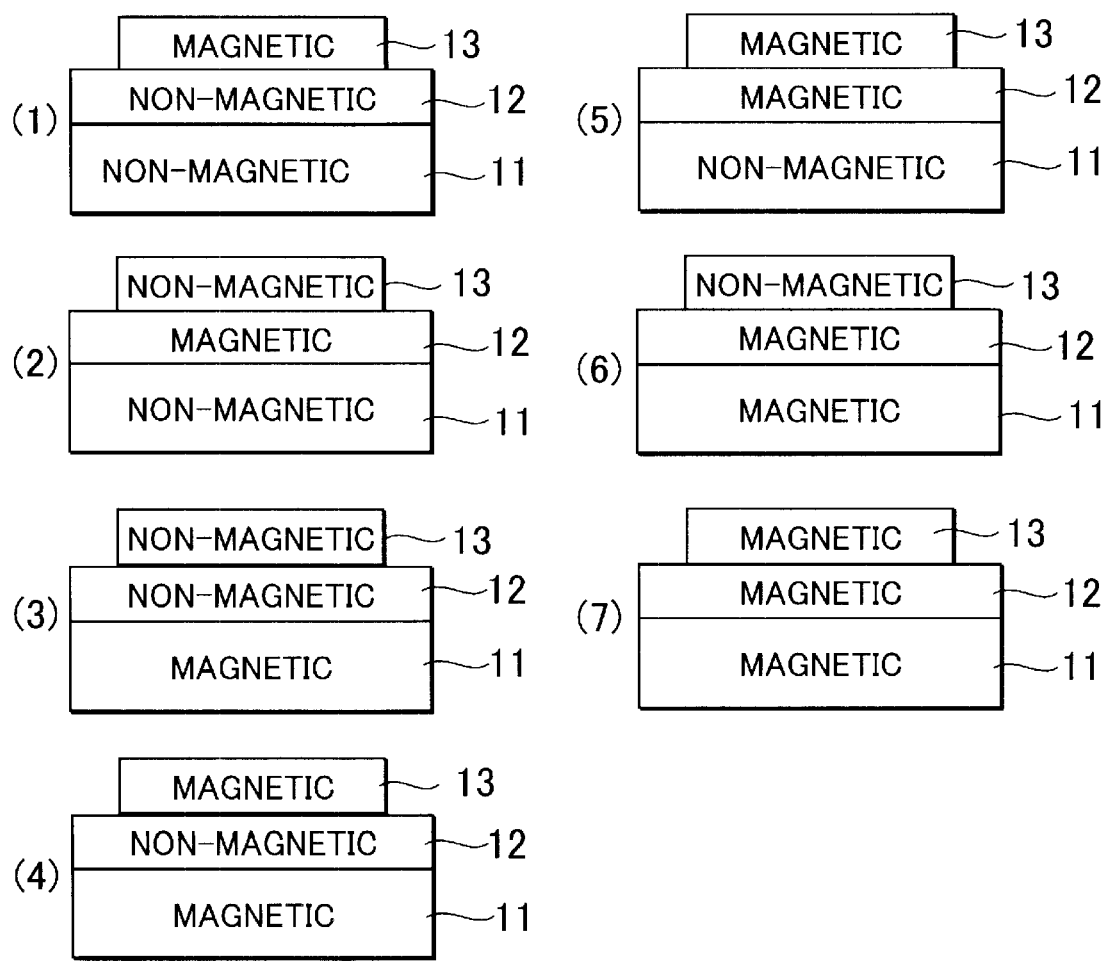
FIGS. 2(1) to 2(7) are diagrammatic views of various forms of constructions, showing the positions of the magnetic layer in the first embodiment.

As shown in FIGS. 2(1) to 2(7), seven types of laminated structures are present depending on the position(s) of the magnetic layer(s) in the laminated structure 10.

As shown in FIG. 2(1), the first construction is such that the first layer 11 comprises a nonmagnetic layer, the second layer 12 comprises a nonmagnetic layer, and the third layer 13 comprises a magnetic layer.

As shown in FIG. 2(2), the second construction is such that the first layer 11 comprises a nonmagnetic layer, the second layer 12 comprises a magnetic layer, and the third layer 13 comprises a nonmagnetic layer.

As shown in FIG. 2(3), the third construction is such that the first layer 11 comprises a magnetic layer, the second layer 12 comprises a nonmagnetic layer, and the third layer 13 comprises a nonmagnetic layer.

As shown in FIG. 2(4), the forth construction is such that the first layer 11 comprises a magnetic layer, the second layer 12 comprises a nonmagnetic layer, and the third layer 13 comprises a magnetic layer.

As shown in FIG. 2(5), the fifth construction is such that the first layer 11 comprises a nonmagnetic layer, the second layer 12 comprises a magnetic layer, and the third layer 13 comprises a magnetic layer.

As shown in FIG. 2(6), the sixth construction is such that the first layer 11 comprises a magnetic layer, the second layer 12 comprises a magnetic layer, and the third layer 13 comprises a nonmagnetic layer.

As shown in FIG. 2(7), the seventh construction is such that each of the first layer 11, the second layer 12, and the third layer 13 comprises a magnetic layer.

Next, an example of a magnetically functioning apparatus having a three-layer structure, in which an uppermost layer, i.e., a third layer 13 is comprised of a ferromagnetic thin film, is described with reference to the diagrammatic perspective views of FIGS. 3(1) and 3(2). In addition, an embodiment of an operation of the magnetically functioning apparatus of the present invention is also described below.

Figure 3:
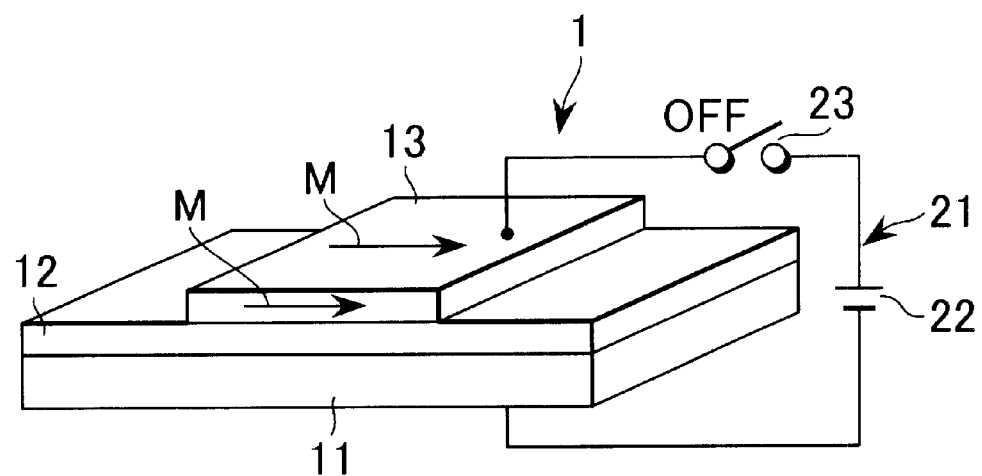
FIGS. 3(1) and 3(2) are diagrammatic perspective views showing one form of construction of a magnetically functioning apparatus having a three-layer structure in which the third layer is comprised of a ferromagnetic thin film.
Figure 3:
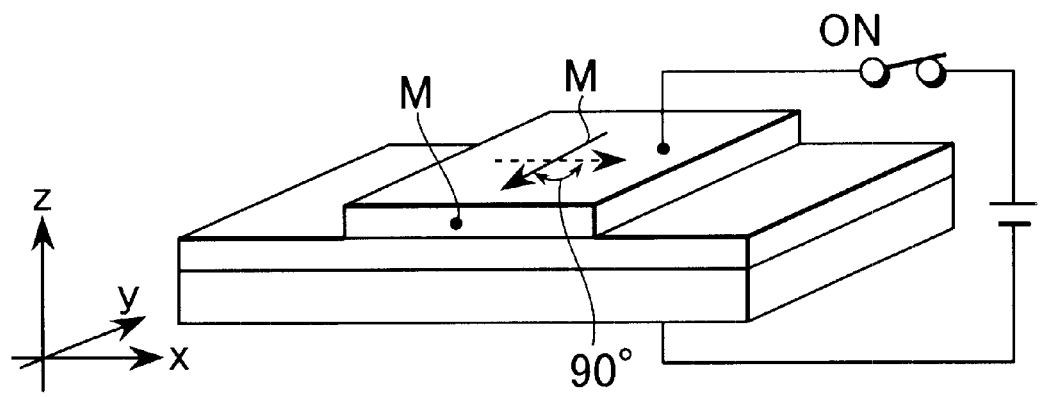

As shown in FIG. 3(1), the apparatus has a construction such that a first layer 11 as an electrode comprises a low-resistance nonmagnetic layer, a second layer 12 comprises a high-resistance nonmagnetic layer, and the third layer 13 comprises a low-resistance magnetic layer, wherein the magnetic layer in the third layer 13 is comprised of a ferromagnetic thin film. An external circuit 21 has the similar construction to that described above with reference to FIG. 1, for example, a construction such that a power source 22 and a switch 23 are connected to each other in series, and the positive electrode in the power source 22 is connected to the first layer 11, and the negative electrode in the power source 22 is connected to the third layer 13.

The ferromagnetic thin film (third layer 13) has a single magnetic domain structure peculiar to scaled-down devices, and the magnetization state of the film is indicated by the direction of a magnetic vector M. In the initial state where the external circuit 21 is in an OFF state, as shown in FIG. 3(1), the magnetic vector M points in an x direction. When the external circuit 21 is in an ON state and a voltage is applied to a magnetically functioning apparatus 1, the magnetic vector M is driven to point in a direction different from the direction in the initial state. When the action of driving has a large enough strength, as shown in FIG. 3(2), the magnetic vector M can be rotated so that an angle between the direction in the initial state (indicated by the dotted arrow) and the direction of the vector rotated becomes 90°.

Thus, the action of changing the direction of the magnetic vector M is caused by the change of magnetic characteristics peculiar to around the surface of the magnetic layer (third layer 13). The magnetic characteristics peculiar to the interface is explained below, taking an example called surface magnetic anisotropy.

On the other hand, the interface magnetic anisotropy is a magnetic anisotropy caused in a magnetic material by a difference in environment between around the surface of the magnetic material and the inner portion of the magnetic material, which magnetic anisotropy is different from that of a bulk material. The smaller the thickness of a thin film, the more remarkable the effect of the interface magnetic anisotropy. For example, when a cobalt (Co) film having a thickness of 0.6 nm is allowed to grow on a Au (111) substrate, the easy direction of magnetization is an in-plane direction, but, when it is allowed to grow on a substrate, the easy direction of magnetization is a perpendicular direction. This is caused by a difference in interface magnetic anisotropy between the Co/Au interface and the Co/Pd interface. This is disclosed in J. A. C. Bland, B. Heinriched, Ultrathin Magnetic Structures I (1994) Springer-Verlag.

Similarly, there is a magnetic anisotropy which is generated on the surface (interface) of a magnetic thin film and which has a property such that it is likely to be magnetized in a specific direction in the thin film plane. This example has been reported with respected to, for example, the Fe thin film deposited on a Cu single crystalline substrate abraded at an angle as small as 1 to 5° to (001) plane (vicinal surface). This is disclosed in Physical Review B, 58 [10] (1998) (U.S.A.), p. 5924–5927.

Figure 4:
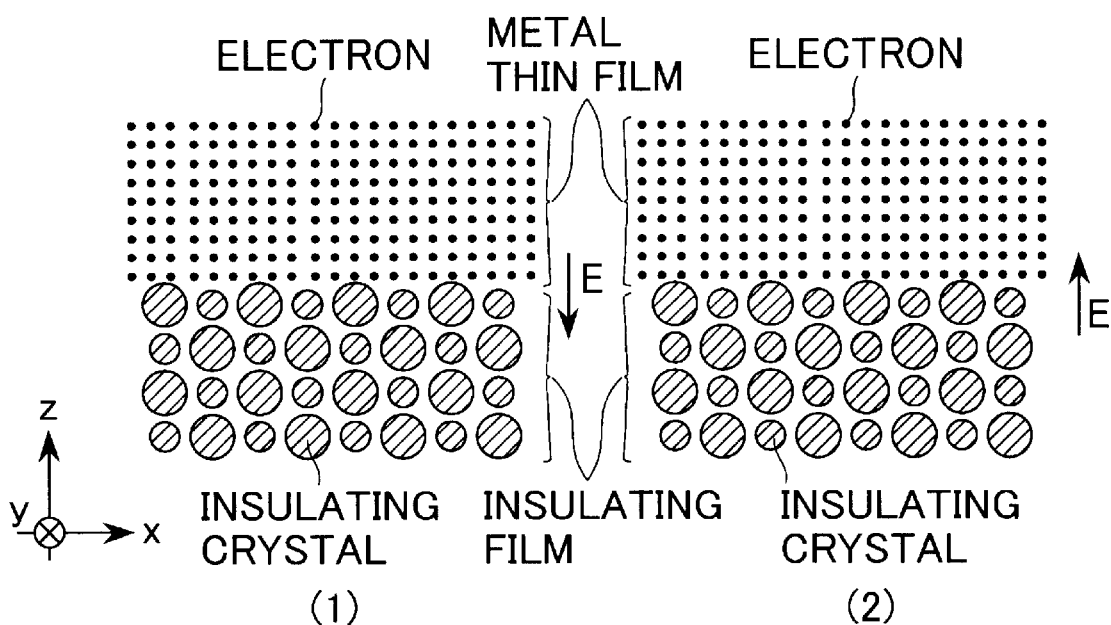
FIGS. 4(1) and 4(2) are explanatory views showing a principle that the magnetic anisotropy is changed by an electric field at an interface.

The principle how the above-mentioned interface magnetic anisotropy arises is described with reference to FIGS. 4(1) and 4(2). FIGS. 4(1) and 4(2) are diagrammatic cross-sectional views including z-axis, showing an interface between an insulator crystal and a metal thin film spreading in the xy-plane.

As shown in FIGS. 4(1) and 4(2), the metal thin film is filled with free electrons which can move around freely, and the interface serves as a barrier that prevent the free electrons from penetrating deep into the insulator. When the three-dimensional structure of the barrier is closely observed, it is found that the barrier has a fine concavo-convex at a level of an atomic size according to the configuration of the atoms constituting the insulator material. Since the atomic concavo-convex structure has a regularly ordered configuration with a certain symmetry at the crystal surface, the same symmetry is reflected in the electronic state at around the interface. And accordingly, a corresponding symmetrical property is induced in the magnetic anisotropy if the metallic film is a magnetic material.

By the way, an electric field can be created at the interface between the insulator and the metal by means of an externally applied voltage. When an electric field E is introduced in the direction pointing from the metal side to the insulator side as indicated by an arrow in FIG. 4(1), the electrostatic force from the field on the electrons acts in the opposite direction. Therefore the electrons around the barrier are pushed back toward the inside of the metal region.

Conversely, as shown in FIG. 4(2), when an electric field E in the direction pointing from the insulator to the metal is applied, the electrons around the barrier are pushed toward the insulator. Thus, the electronic state around the interface can be changed by an external electric field, and therefore the interface magnetic anisotropy reflecting the electronic state can be changed. The direction of the magnetization vector in a magnetic thin film tends to point a direction such that the magnetic anisotropy energy becomes smaller. Therefore, when the easy axis of magnetization determined by the interface magnetic anisotropy is changed by an external electric field, the direction of the magnetization vector changes in accordance with this change, that is, deflection of magnetization vector is driven. This is the principle that changing of the interface magnetic anisotropy by an external electric field achieves driving of magnetization. The magnetic characteristics that can be changed by the electric field at the interface are not limited to the interface magnetic anisotropy. The interface magnetostriction or magnetic coupling at the interface is also changed.

A total magnetic anisotropy $K_{total}$ of a magnetic thin film having an area S and a thickness t is represented by the following equation: $K_{total}=K_v \cdot S \cdot t + 2 \cdot K_s \cdot S$, wherein $K_v \cdot S \cdot t$ is a component for a bulk material, which is proportional to the volume (S x t), and $2 \cdot K_s \cdot S$ is a component which is proportional to the surface area of the thin film or the area (2×S) of the interface. In a level of the size of the conventional magnetic device, since the thickness t is very small, it is considered that the surface (interface) does not largely contribute to the magnetic anisotropy, and therefore there was no concept of utilizing this as a driving force for magnetization. Utilization of modulation of the surface magnetic anisotropy as a magnetization driving method is an invention such that the principle itself is novel and the device structure and material are not limited, wherein examples of industrial utilization of the magnetization driving method are disclosed here. Hereinbelow, the magnetic characteristics modulation method employing the structure for electric field application shown in FIG. 1 for driving magnetization by utilizing the change of the magnetic characteristics due to an electric field at the interface is described.

As shown in FIG. 1, a laminated structure in which a first layer 11 comprised of a low-resistance thin film, a second layer 12 having a higher electrical resistivity than that of the first layer 11, and a third layer 13 having a lower electrical resistivity than that of the second layer 12 are stacked on one another is used. At least one layer selected from the group consisting of the first layer 11, the second layer 12, and the third layer 13 comprises a magnetic layer comprised of a material exhibiting a magnetic property. An external circuit 21 is connected to both the first layer 11 and the third layer 13. The external circuit 21 has a construction such that, for example, a power source 22 and a switch 23 are connected to each other in series. For example, the positive electrode in the power source 22 is connected to the first layer 11, and the negative electrode in the power source 22 is connected to the third layer 13.

By utilizing an effect such that, when a voltage V is applied to between the first layer 11 and the third layer 13 by means of the external circuit 21 to change the electron state of the surface of the magnetic layer, the change of the electron state causes the magnetic anisotropy or magnetostriction of the magnetic layer or the magnetic coupling between the magnetic layer and the adjacent magnetic layer to change, the magnetization state of a magnetic thin film is changed.

Next, an improvement of the above-described magnetic characteristics modulation method to facilitate driving of magnetization is described below.

Figure 5:
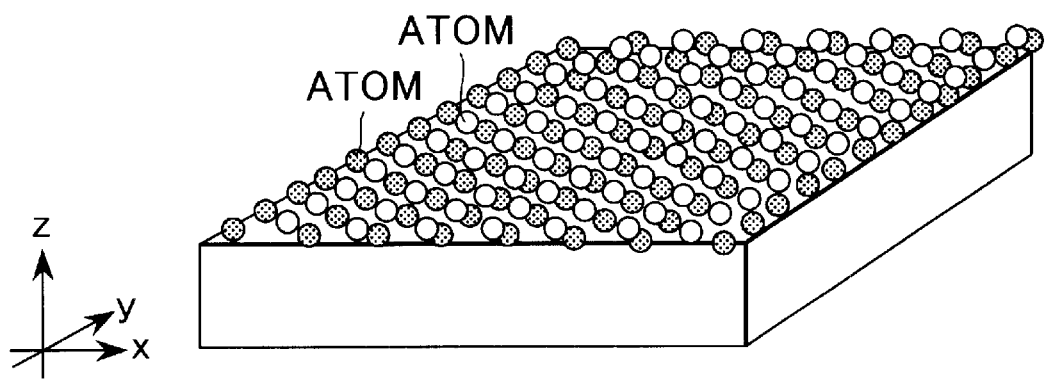
FIG. 5 is a diagrammatic perspective view showing the periodic atomic configuration in a single crystal surface.

As diagrammatically shown in FIG. 5, a single crystalline material having a highly ordered, three-dimensionally periodic structure in the interface and having ordered atomic configuration is utilized. Specifically, the surface of the magnetic layer or the surface of a thin film facing the surface of the magnetic layer is comprised of a single crystal.

Figure 6:
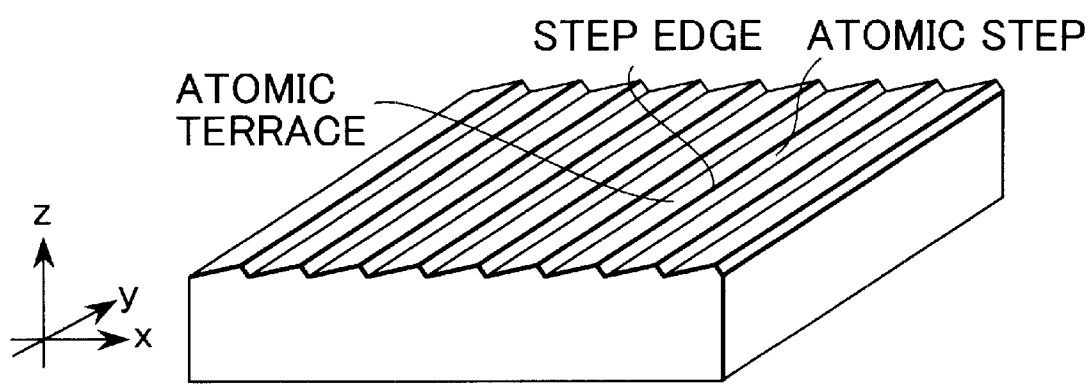
FIG. 6 is a diagrammatic perspective view showing the ordered step arrangement in a vicinal surface.

For imparting an intensive asymmetric property with respect to the x direction to the electron state around the interface, as shown in FIG. 6, a single crystal having periodically repeated atomic terraces and atomic steps in the surface thereof constituting the interface is used. That is, the single crystal has in the surface thereof ordered atomic step configuration having a predetermined period.

For realizing the above periodically repeated atomic terraces and atomic steps at the interface, the above-described single crystal having a vicinal surface is utilized. For example, a single crystalline substrate having a vicinal surface is utilized.

Figure 7:
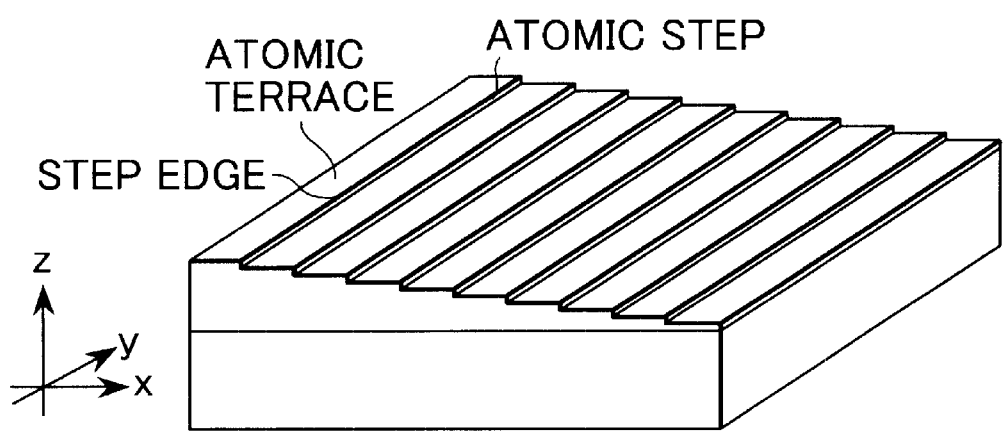
FIG. 7 is a diagrammatic perspective view showing the ordered step arrangement in a gradient film thickness layer.

As shown in FIG. 7, for realizing the above periodically repeated atomic terraces and atomic steps at the interface, the above-described epitaxial thin film having a thickness which linearly changes in one direction is utilized.

Figure 8:
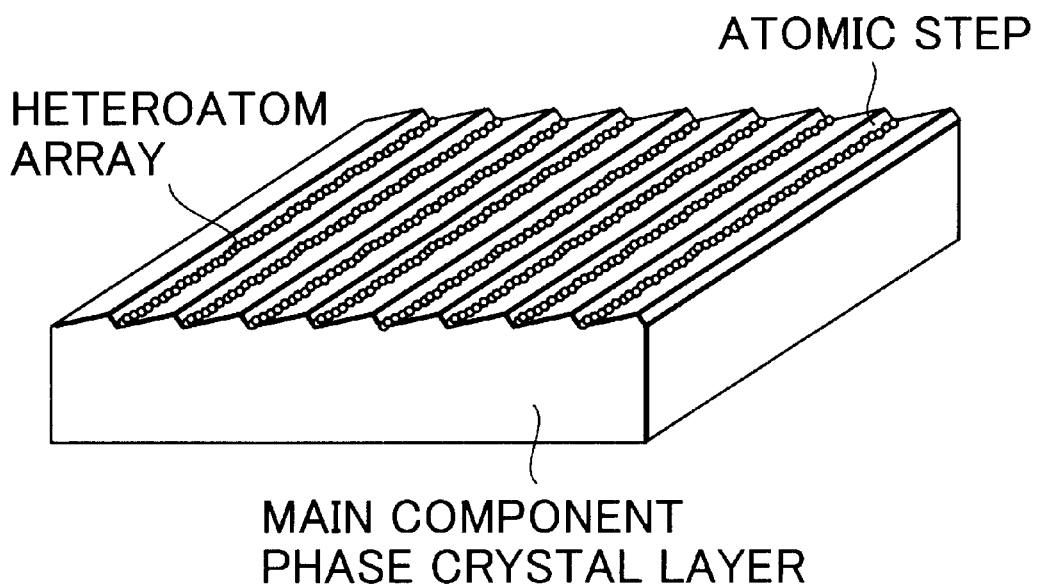
FIG. 8 is a diagrammatic perspective view showing one form of an ordered, modified structure by atomic configuration.

Further, for imparting an intensive asymmetric property with respect to the x direction to the electron state around the interface, as shown in FIG. 8, magnetic or nonmagnetic heteroatoms are disposed along the periodic atomic step configuration formed in the surface of the main component phase crystal layer to modify the surface with a so-called heteroatom array.

As an example of the surface modification, there can be mentioned a Au reconstructed surface coated with iron (Fe) atoms deposited in a 0.2 to 0.8 atomic layer. In this case, the Fe atomic configuration is not linear but in a herringbone structure periodically fold. Further, the atomic configuration in the above surface modification is not limited to be in one array but may be, for example, in a plurality of arrays. Alternatively, it may be a linear configuration.

Figure 9:
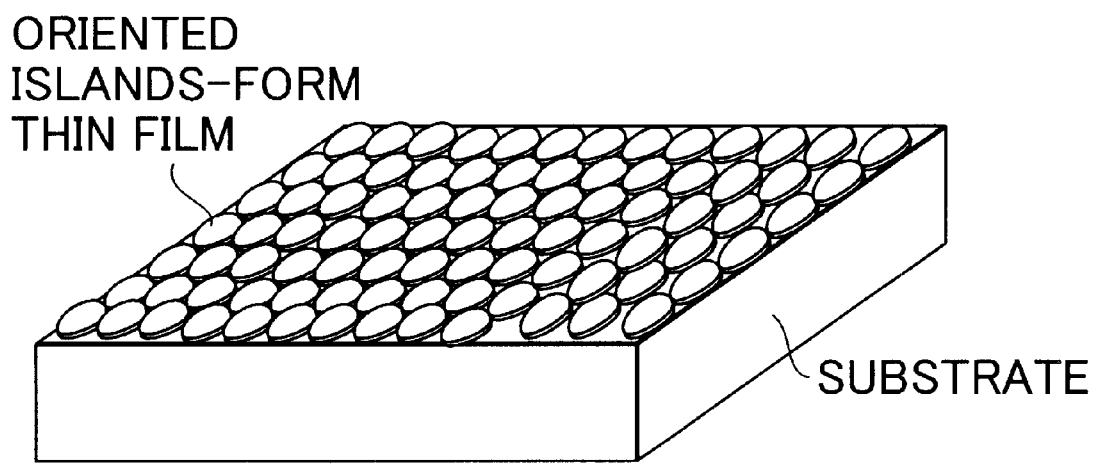
FIG. 9 is a diagrammatic perspective view showing another form of an ordered, modified structure by atomic configuration.

In the above-mentioned construction, the periodic concavo-convex in the interface is a fine concavo-convex at an atom level obtained using a single crystal, but, as an example having a larger structure which can be generally used, as shown in FIG. 9, the surface of the magnetic layer or the surface of a thin film facing the surface of the magnetic layer may have a periodic concavo-convex structure.

As such a structure, for example, there can be mentioned a thin film surface grown in an oriented islands-form on a substrate shown in FIG. 9, or a thin film surface grown having a column structure, a MnBi dot thin film obtained on a GaAs substrate, and a non-solid-solution two-phase granular thin film.

Figure 10:
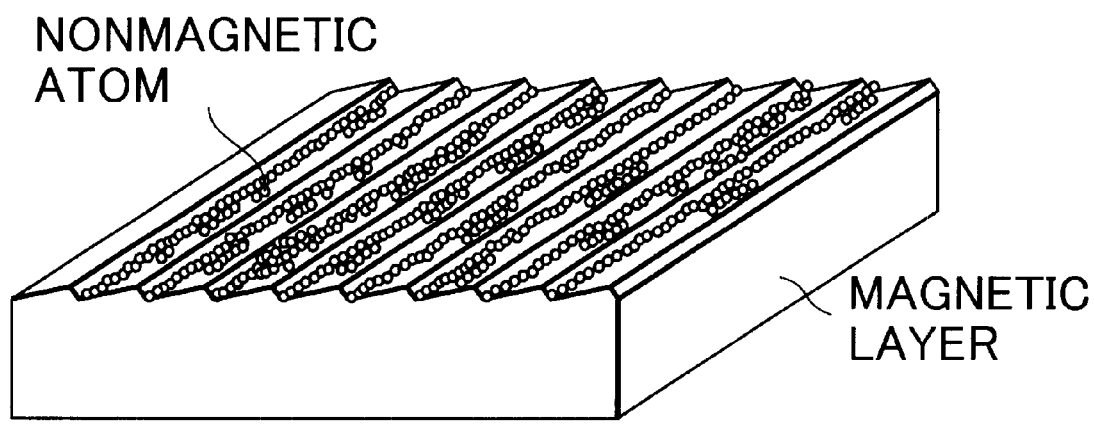
FIG. 10 is a diagrammatic perspective view showing one form of a modified structure of a magnetic material surface by nonmagnetic atoms.

Further, in the modified construction by heteroatoms at the interface shown in FIG. 10, for example, the configuration of the heteroatoms after modification is not necessarily ordered. Specifically, a construction is such that nonmagnetic atoms are disposed in a 0.8 or less atomic layer on the surface of the magnetic layer or the surface of a thin film facing the surface of the magnetic layer.

In the above construction, when the magnetic coupling between two magnetic layers which are in contact with each other at an interface is too strong, the magnetic coupling can be appropriately rendered weak, thus enabling an operation suitable for the magnetic characteristics modulation method described above with reference to FIG. 1.

The magnetic thin film (magnetic layer) with its magnetization driven by the above-described magnetic characteristics modulation method may be magnetically coupled to an auxiliary magnetic layer which is additionally prepared besides the original magnetic layer. This magnetic coupling, if properly introduced, is useful for tuning the operation characteristics of the magnetic layer.

Figure 11:
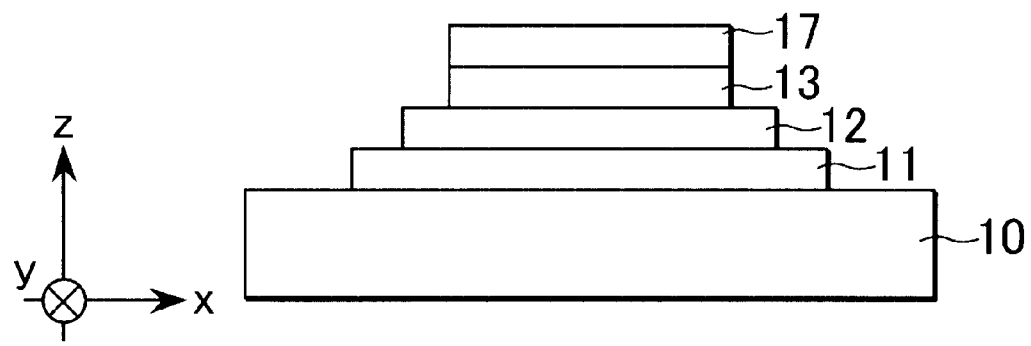
FIG. 11 is a diagrammatic view showing one form in which a magnetic layer is in contact with a magnetic layer different from the magnetic layer.

An example in which the magnetic layer is coupled to an auxiliary magnetic layer is shown in FIG. 11. The laminated structure has a form in which the additional magnetic layer 17 for tuning is stacked on the magnetic layer (third layer) 13 to be driven. Specifically, the laminated structure has a construction such that, on a substrate 10, a first layer 11 comprised of a low-resistance layer (electrode), a second layer 12 comprised of a high-resistance layer, a third layer 13 comprised of a low-resistance layer (magnetic layer to be driven), and the additional magnetic layer 17 for characteristics regulation are stacked on one another in this order.

The form of contact of the additional magnetic layer 17 is not limited to the above example. For example, like an abut layer used in the design of a magnetoresistance effect magnetic head (MR head), two magnetic layers may be disposed side by side on the same plane so that the edge portions of the respective films are in contact with each other. Magnetic characteristics that can be tuned by the above means, for example, magnetic anisotropy, magnetostriction, and exchange biasing.

Figure 12:
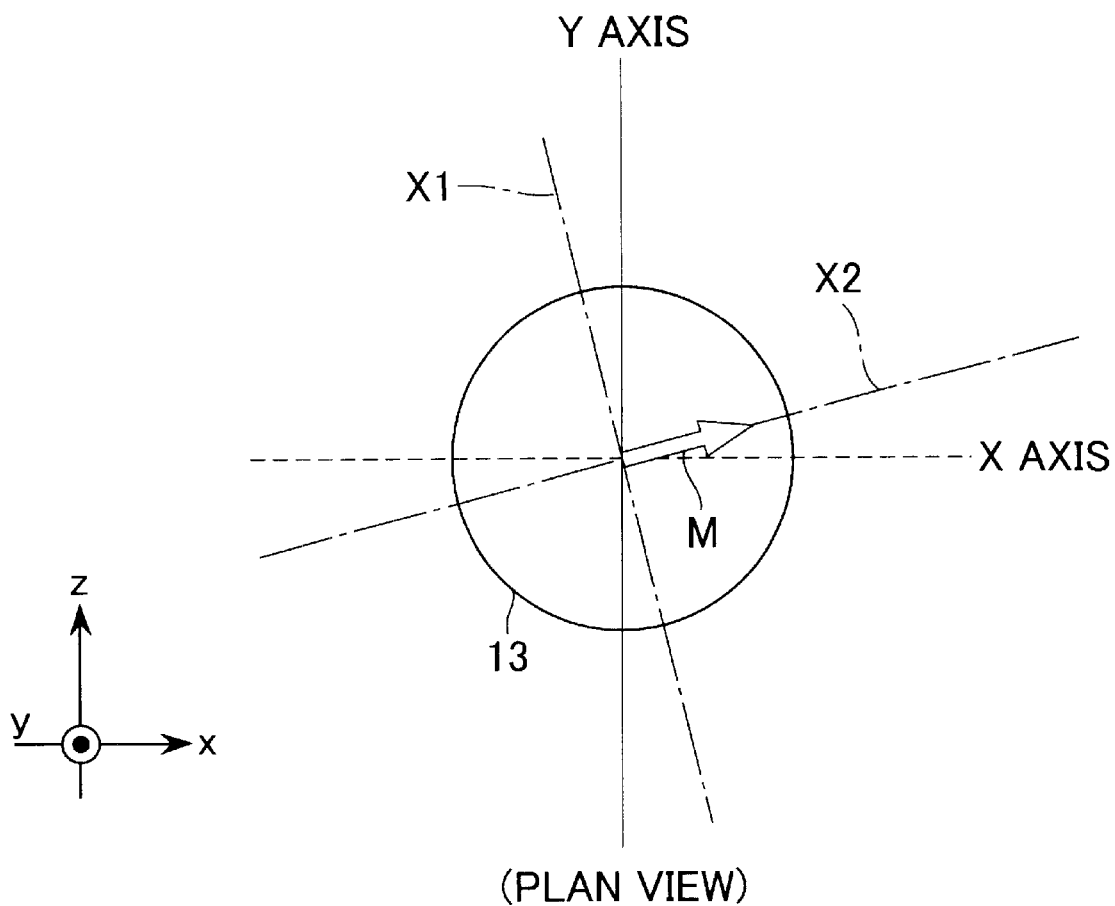
FIG. 12 are explanatory views showing an example of a direction of the easy axis of magnetization which is adjusted for driving at 180°.
Figure 12:
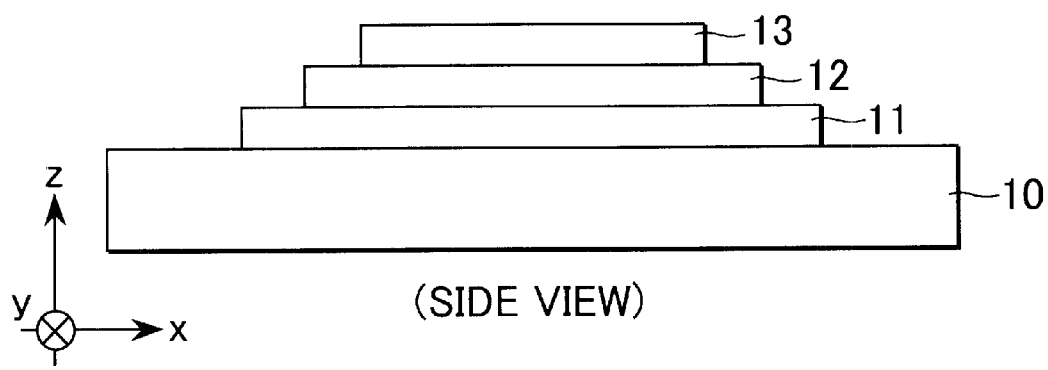

In the above-described magnetic characteristics modulation method, even when using a driving method in which the range of the driving of magnetization is limited to 90° or less, a laminated structure shown in FIG. 12 such that a first layer 11 comprised of a low-resistance thin film, a second layer 12 having a higher electrical resistivity than that of the first layer 11, and a third layer 13 having a lower electrical resistivity than that of the second layer 12 are stacked on one another is used. The third layer 13 comprises a magnetic layer. In this construction, when the magnetic thin film (third layer 13) having the magnetization driven has the properties below while maintaining the directional relationship shown in the figure, driving of magnetization beyond 90° and reaching to 180° or more (reversal of magnetization) is possible.

The properties necessary for magnetization reversal consists of following three conditions. (1) When no external voltage is applied to the system, the magnetic layer has an in-plane magnetic anisotropy with four-fold symmetry having two easy axes of magnetization, X1 and X2, crossing at an angle of 90° in the film plane. (2) The angle between the easy axis of magnetization associated with the uniaxial magnetic anisotropy induced by the external voltage and either of the easy axes of above-mentioned four-fold anisotropy, X1 or X2, is between 5° and 30°. (3) The easy axis of magnetization associated with the voltage-induced uniaxial magnetic anisotropy can be rotated about 90° when either of the following parameters is changed; the polarity of the voltage, the absolute value of the voltage, or the interface across which the electric field is generated by applying the external voltage to the layer structure.

As mentioned above, by combining the above-mentioned magnetic characteristics modulation method with a driving principle in which the driving range is 90° or less, a method for realizing driving of magnetization at 180° or more (reversal of magnetization) can be effected.

Further, when the driving force for magnetization is generated at the surface of the thin film, an action of driving can be caused on both the surface and back surface of the one layer of thin film. That is, the magnetic layer receives a driving force on both the surface and back surface thereof.

By generating driving forces in the same direction at interfaces on both sides simultaneously, a strong driving force as a whole with respect to the magnetization of the magnetic layer between the both interfaces can be obtained. Alternatively, by generating driving forces in different directions at the individual interfaces on both sides, an operation embodiment suitable for a binary memory such that "the magnetic vector in the x direction in the initial state is changed to point in the y direction by driving from the surface, and then, the magnetic vector is returned to point in the x direction by driving from the back surface" can be realized.

As mentioned above, for regulating the characteristics of the magnetic layer having the magnetization driven, an additional magnetic layer different from the magnetic layer is used. The additional magnetic layer may be comprised of an antiferromagnetic material film. That is, a construction may be such that the magnetic layer is contact with an antiferromagnetic material layer.

Further, the antiferromagnetic material layer has a feature such that the magnetization readily moves in one direction with respect to the ferromagnetic material layer to which the antiferromagnetic material layer itself is coupled by exchange interaction, namely, it exhibits a biasing effect.

In addition, when a semiconductor is used in the construction of the magnetic characteristics modulation method, the construction can be formed so that the energy barrier at the interface between the semiconductor and a metal or at the interface between the semiconductor and an insulator is lower than the barrier at an interface between a metal and an insulator which are in contact with each other. For this reason, as described above with reference to FIGS. 4(1) and 4(2), an effect of rendering more remarkable "the change of the electron state around the interface by an external electric field" to cause the action of driving of magnetization to be more remarkable can be obtained. When a magnetic semiconductor is used, its magnetization can be an element to be driven. That is, a construction such that at least one layer in the magnetic layers is comprised of a semiconductor or a magnetic semiconductor can be used.

Hereinbelow, examples of constructions of a magnetically functioning apparatus which realizes the magnetic characteristics modulation method of the present invention will be described.

First, the first embodiment having a multilayer structure which contains one magnetic layer is described with reference to the diagrammatic cross-sectional view of FIG. 13.

Figure 13:
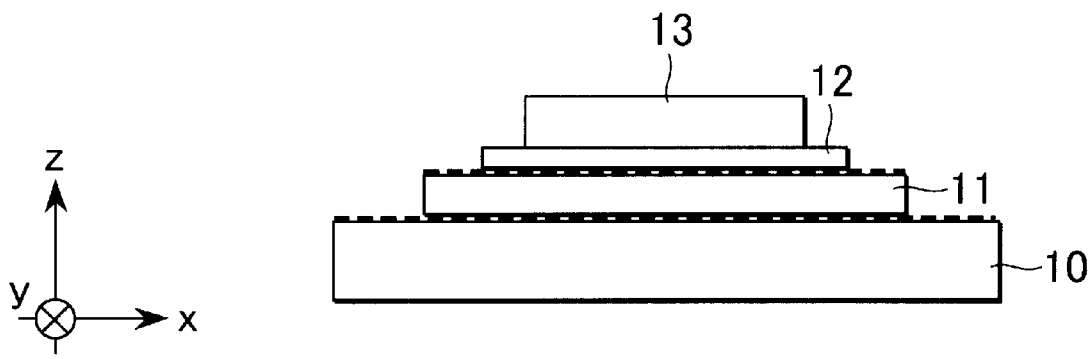
FIG. 13 is a diagrammatic cross-sectional view showing the first embodiment having a multilayer structure which contains one magnetic layer.

As shown in FIG. 13, on a substrate 10 comprised of a MgO single crystal, a first layer 11 comprised of a $ZnFe_2O_4$ (zinc ferrite) layer, a second layer 12 comprised of an $Al_2O_3$ layer, and a third layer 13 comprised of a Ni—Fe layer are stacked on one another in this order. The $Al_2O_3$ layer is an excellent thin insulating material free of a defect. The $ZnFe_2O_4$ layer is a nonmagnetic oxide at room temperature and has a resistivity as relatively low as 100 Ωcm, and therefore it can be used as an electrode layer. Further, the MgO substrate has a vicinal surface, and $ZnFe_2O_4$ and then $Al_2O_3$ are allowed to undergo epitaxial growth on the MgO substrate to form a $ZnFe_2O_4$ layer and an $Al_2O_3$ layer each having ordered step arrangement in the surface thereof. The magnetization of the Ni—Fe layer is driven by an external electric field applied to the Ni—Fe layer/$Al_2O_3$ layer interface having the step arrangement.

Next, the second embodiment having a multilayer structure which contains one magnetic layer is described with reference the diagrammatic cross-sectional view of to FIG. 14.

Figure 14:
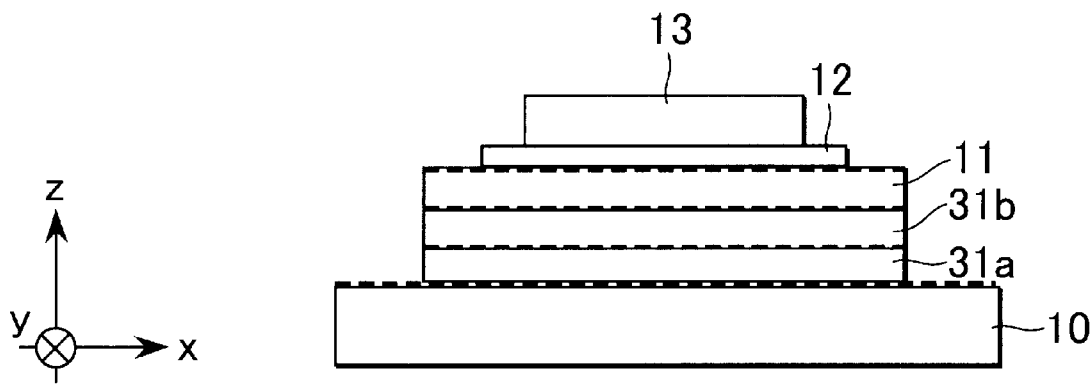
FIG. 14 is a diagrammatic cross-sectional view showing the second embodiment having a multilayer structure which contains one magnetic layer.

As shown in FIG. 14, on a substrate 10 comprised of a MgO substrate, a Ag layer 31a, a Au layer 31b, a first layer 11 comprised of an Fe layer, a second layer 12 comprised of a MgO layer, and a third layer 13 comprised of a Cu layer are stacked on one another in this order. The number of the layers is larger than three, but each of the Au layer 31a and the Ag layer 31b is an under layer used as a means for growing a high quality Fe epitaxial film free of a defect, and the action of driving the magnetization of the Fe layer is generated at the MgO/Fe interface by a voltage applied to between the Fe layer and the opposite electrode comprised of a Cu layer through the MgO layer comprised of an insulating material, and thus this structure is substantially included in the three-layer structure. In this example, the MgO substrate has a vicinal surface, and therefore a material for the upper magnetic layer is allowed to undergo epitaxial growth on the MgO substrate to form a magnetic layer (first layer 11 comprising an Fe layer) having the same stepped structure in the surface thereof as the stepped structure in the MgO substrate surface.

Next, the third embodiment having a multilayer structure which contains one magnetic layer is described with reference to the diagrammatic cross-sectional view of FIG. 15.

Figure 15:
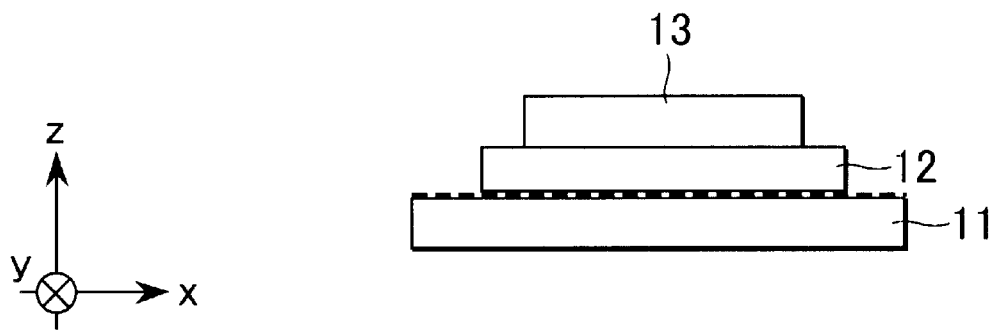
FIG. 15 is a diagrammatic cross-sectional view showing the third embodiment having a multilayer structure which contains one magnetic layer.

As shown in FIG. 15, on a first layer 11 comprised of a Cr substrate, a second layer 12 comprised of a $NiFe_2O_4$ (nickel ferrite) layer, and a third layer 13 comprised of a Pt layer are stacked on one another in this order. In this structure, the Cr substrate serves as the first layer 11. The $NiFe_2O_4$ layer is a ferrimagnetic material at room temperature and exhibits magnetization. In addition, the $NiFe_2O_4$ layer has a resistivity as high as $10^9$ Ωcm, and this layer is used as an intermediate layer in the three-layer structure to generate a driving force on the both surfaces. From this point, a construction is such that a magnetic thin film having the magnetization driven receives a driving force on both the surface and back surface thereof.

Further, the Cr substrate (first layer 11) has a vicinal surface, and therefore nearly periodic array of atomic steps exists on the surface. Since the $NiFe_2O_4$ layer is deposited on the Cr vicinal surface with atomic steps, the interface has regular corrugation associated with the atomic steps, and it provides an action of driving at the $NiFe_2O_4$/Cr interface. In addition, the $NiFe_2O_4$ layer is formed so that the thickness linearly increases in one direction. A regular array of atomic steps is also formed on the upper surface, due to the thickness variation, which leads to a driving action at the upper interface of the $NiFe_2O_4$ layer.

The variety of methods preparing regular arrays of atomic steps on each of the surfaces of a magnetic layer, as described above, is important to control the polarity of driving force so that the driving forces from the opposite sides of the layer are constructively added. Further discussion on this aspect is given below.

A case in which no regular array of atomic steps is prepared on the surface of magnetic inter layer, $NiFe_2O_4$, is considered. It is presumed that a higher voltage than a Cr substrate is applied to an upper Pt electrode. In this instance, the electric field generated in the high-resistance region points the −z direction, and therefore, electrons are drawn to in the +z direction. Then, electrons at the upper surface of the $NiFe_2O_4$ layer are pulled outwards from the magnetic layer, and, on the other hand, electrons at the lower surface tend to be pushed inwards, and thus electronic states at the upper and the lower interface experience opposite influences. Since the structure of the upper surface is similar to that of the lower surface in this case, the change in the electronic states under the above-mentioned opposite influences lead to opposite effects on the magnetic anisotropy of the $NiFe_2O_4$ layer. Therefore, the driving forces on the magnetization of the magnetic layer from the upper surface and that from the lower surface cancel out each other.

For avoiding such canceling out and obtaining a collectively large change of the magnetic anisotropy, here, the vicinal surface of a single crystalline substrate for obtaining atomic step arrangement and the epitaxial thin film having a thickness which linearly changes in one direction for obtaining atomic step arrangement are individually used for each surface. Specifically, the direction of the vicinal surface of the Cr substrate is selected for the lower interface of the magnetic layer so that the atomic steps are made parallel to the y-axis. On the other hand, for the upper interface of the ($NiFe_2O_4$) magnetic layer, the $NiFe_2O_4$ layer is formed in a wedge shape so that the thickness increases along the y direction and the atomic steps are made parallel to the x axis.

Assume, regarding the interface with an array of parallel atomic steps between the magnetic ferrite crystal and the metal, that "when interface electrons are pushed towards the metal, the easy axis of magnetization associated with the interface magnetic anisotropy of the ferrite arises parallel to the atomic steps". Applying this assumption to the structure and the field direction described in the former paragraph, the polarity of voltage-induced interface magnetic anisotropy can be expected as follows. At the upper surface of the ferrite, the easy axis of magnetization becomes parallel to the atomic steps, i.e., x direction, and, at the lower surface of the ferrite, the easy axis of magnetization becomes perpendicular to the atomic steps, i.e., again parallel to x-axis. As a consequence, the driving forces on magnetization generated at the both interfaces do not cancel out but cooperate.

While the above explanation was made on the case where "when interface electrons are pushed towards the metal, the easy axis of magnetization associated with the interface magnetic anisotropy of the ferrite arises parallel to the atomic steps", cooperative combination of driving forces arising from different sides of a magnetic layer can be established similarly for the opposite case where "when electrons are pushed to the metal, the interface magnetic anisotropy of the ferrite is likely to have an easy axis of magnetization perpendicular to the atomic steps".

When the component of the interface magnetic anisotropy which can be modulated by an external electric field depends only on the surface morphology associated with the regular array of parallel atomic steps, the direction of the easy axis of magnetization arises either parallel or perpendicular to the atomic steps. Therefore, a cooperative combination of driving forces from different interfaces in a device may be realized by preparing the directions of atomic steps so that the easy axes of respective interface anisotropy coincide in the same direction (x direction in the above example) with respect to the laboratory coordinate system.

Further, the electric field response component of the interface magnetic anisotropy possibly depends on a concavo-convex other than the step arrangement (for example, atomic configuration of a crystal lattice). In such a case, a method is used in which different materials to be in contact with the both surfaces of the magnetic layer are selected.

Next, the forth embodiment having a multilayer structure which contains one magnetic layer is described with reference to the diagrammatic cross-sectional view of FIG. 16.

Figure 16:
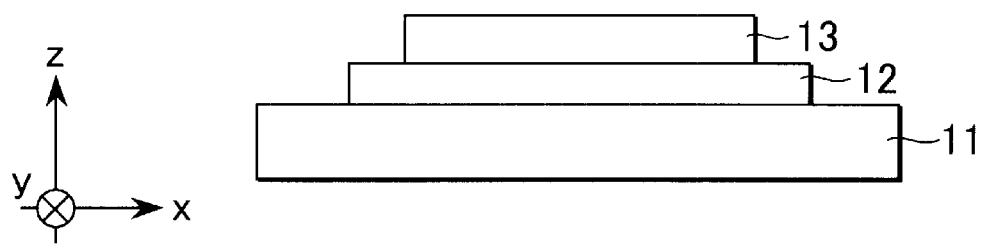
FIG. 16 is a diagrammatic cross-sectional view showing the forth embodiment having a multilayer structure which contains one magnetic layer.

As shown in FIG. 16, a first layer 11 comprised of a GaAs substrate, a second layer 12 comprised of a (Ga, Mn) As layer, and a third layer 13 comprised of a Cu layer are stacked on one another in this order. This construction is an example in which the GaAs substrate serves as the first layer 11, and a Mn-substituted GaAs which is a magnetic semiconductor is used as the second layer 12, and at least one layer in the magnetic layers is comprised of a magnetic semiconductor. In this construction, the magnetization of the (Ga, Mn) As layer itself is driven.

In addition to (Ga, Mn) As, as a magnetic semiconductor exhibiting a magnetic property at room temperature, for example, $CdMnGeP_2$ disclosed in Medvedkin, et. al., Jpn. J. Appl. Phys. 39 (2000), L949–L951 can be utilized.

Next, the fifth embodiment having a multilayer structure which contains one magnetic layer is described with reference to the diagrammatic cross-sectional view of FIG. 17.

Figure 17:
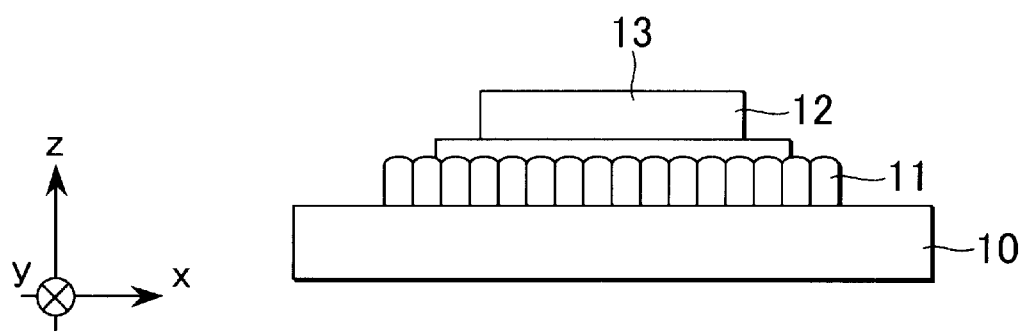
FIG. 17 is a diagrammatic cross-sectional view showing the fifth embodiment having a multilayer structure which contains one magnetic layer.

As shown in FIG. 17, a first layer 11 comprised of a Cu layer having an ordered concavo-convex in the surface thereof is formed on a substrate 10 comprised of a glass substrate, and a second layer 12 comprised of an $Al_2O_3$ layer and a third layer 13 comprised of a Co—Nb—Zr amorphous magnetic layer are stacked on one another in this order on the first layer.

For obtaining an interface having an ordered concavo-convex, a single crystal is not used but a Cu polycrystalline thin film formed on a glass substrate is used. The Cu thin film is deposited by sputtering so that Cu atoms enter the substrate surface in a direction inclined at a certain angle to the substrate normal (for example, a direction inclined at an angle of 35° to the substrate normal). By the effect of inclined entering deposition, the Cu thin film surface has an ordered concavo-convex as shown in FIG. 9.

The above surface is coated with an $Al_2O_3$ thin layer, and a Co—Nb—Zr amorphous magnetic layer is deposited thereon to form a multilayer structure containing one magnetic layer. The $Al_2O_3$ thin layer is excellent as a thin insulating layer material which precisely reflects the concavo-convex of the underlying Cu surface. The Co—Nb—Zr alloy film is an amorphous film, and therefore is suitable for smoothly covering the under layer to obtain a surface having a concavo-convex.

Further, Co—Nb—Zr is an amorphous alloy, and has no crystal magnetic anisotropy. Therefore, it has an advantage in that the magnetic characteristics are substantially determined only by the interface magnetic anisotropy determined by the form of the interface, and the effect of modulation of the interface magnetic anisotropy by an external electric field is remarkably exhibited as a driving force for magnetization. The magnetic layer is constituted using Co—Nb—Zr amorphous, and therefore, this construction corresponds to an example in which the surface of the magnetic layer or the surface of a thin film facing the surface of the magnetic layer has a periodic concavo-convex structure.

Next, the sixth embodiment having a multilayer structure which contains one magnetic layer is described with reference to the diagrammatic cross-sectional view of FIG. 18.

Figure 18:
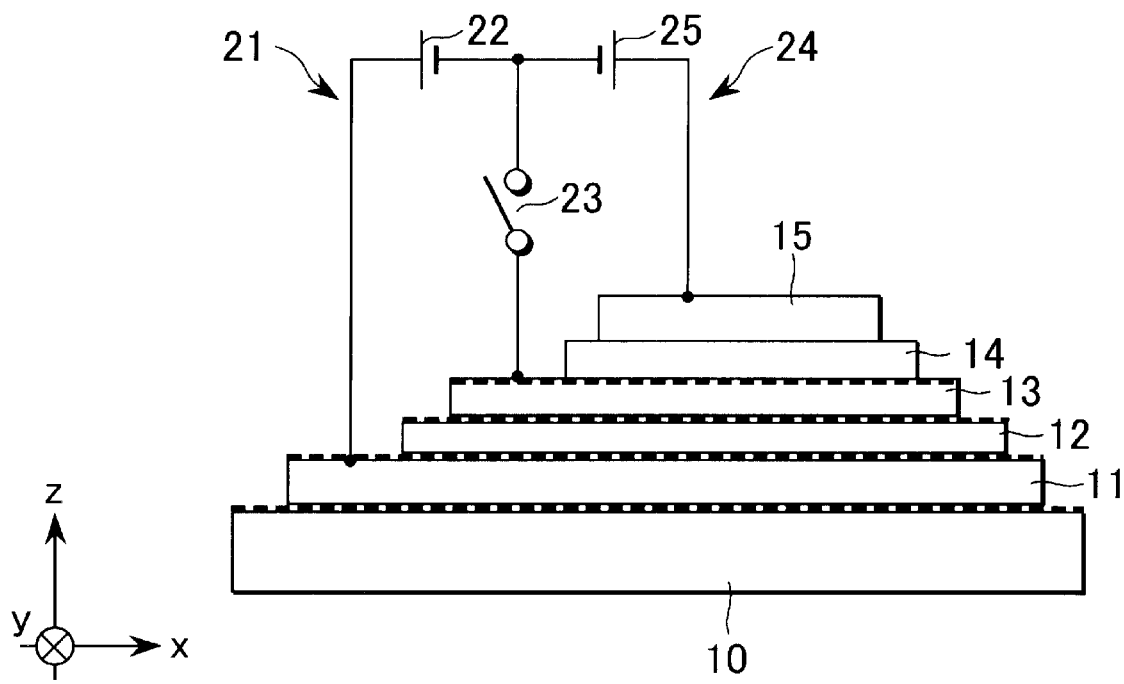
FIG. 18 is a diagrammatic cross-sectional view showing the sixth embodiment having a multilayer structure which contains one magnetic layer.

As shown in FIG. 18, on a substrate 10 comprised of a MgO substrate, a first layer 11 comprised of a $ZnFe_2O_4$ (zinc ferrite) layer, a second layer 12 comprised of a MgO layer, a third layer 13 comprised of an Fe layer, a forth layer 14 comprised of an $Al_2O_3$ layer, and a fifth layer 15 comprised of a Cu layer are stacked on one another in this order. An external circuit 21 is connected to both the first layer 11 and the third layer 13, and the external circuit 21 has a construction such that, for example, a power source 22 and a switch 23 are connected to each other in series. For example, the positive electrode in the power source 22 is connected to the first layer 11, and the negative electrode in the power source 22 is connected to the third layer 13. Further, an external circuit 24 is connected to both the third layer 13 and the fifth layer 15, and the external circuit 24 has a construction such that, for example, a power source 25 and the switch 23 are connected to each other in series. For example, the positive electrode in the power source 24 is connected to the fifth layer 15, and the negative electrode in the power source 24 is connected to the third layer 13.

In the above construction, the MgO substrate has a vicinal surface, and materials for upper layers are allowed to undergo epitaxial growth on the MgO substrate to form a $ZnFe_2O_4$ layer, a MgO layer, an Fe layer, and an $Al_2O_3$ layer each having ordered step arrangement in the surface thereof.

In the above construction, the Fe layer is only one magnetic layer having the magnetization driven, and a feature of this structure resides in that an electrode layer comprising a $ZnFe_2O_4$ (zinc ferrite) layer is formed under the Fe layer through the MgO layer which is an insulating layer, and an electrode layer comprising a Cu layer is formed on the Fe layer through the $Al_2O_3$ layer which is an insulating layer. In other words, when an electric field is applied to the upper surface of Fe in the upper half three-layer structure of $Cu/Al_2O_3/Fe$ using the external circuit shown in the figure, a driving force for magnetization can be generated, and, when an electric field is applied to the lower surface of Fe in the lower half three-layer structure of $Fe/MgO/ZnFe_2O_4$, a driving force for magnetization can be generated, thus realizing driving of magnetization of a magnetic thin film from both the surface and back surface.

Each of the $ZnFe_2O_4$ layer, which is an electrode layer, and the MgO layer, which is an insulating layer and present on the $ZnFe_2O_4$ layer, is an epitaxial thin film employed for taking over the step arrangement form in the MgO substrate surface having a vicinal surface to the surface of Fe which is a magnetic layer.

In this embodiment, the directions of the driving forces generated at the interfaces on both sides can be individually determined by selecting the polarity of the external voltage. Therefore, this embodiment has an advantage in that there is no need "to design the interfaces on both sides (to select the directions of the step arrangements) so that the driving forces from the both sides of the magnetic layer do not cancel out" as required in the above third embodiment described as another example of receiving a driving force at the interfaces on both sides of the magnetic layer having the magnetization driven.

Next, the first embodiment having a multilayer structure which contains two magnetic layers is described with reference to the diagrammatic cross-sectional view of FIG. 19.

Figure 19:
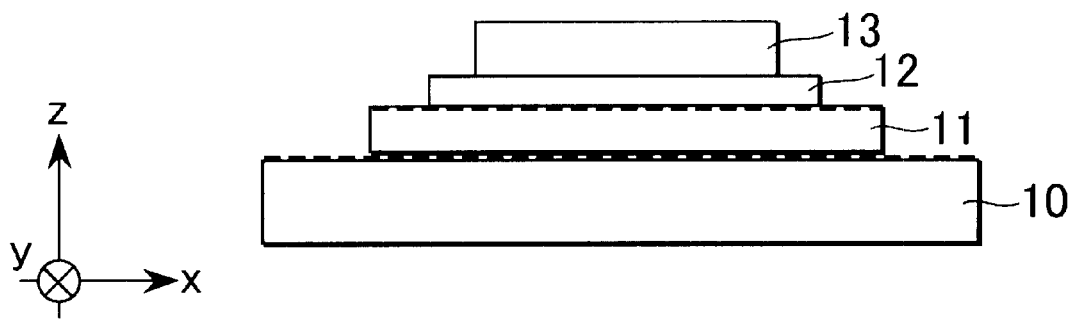
FIG. 19 is a diagrammatic cross-sectional view showing the first embodiment having a multilayer structure which contains two magnetic layers.

As shown in FIG. 19, on a substrate 10 comprised of a MgO substrate, a first layer 11 comprised of a (Mn, Zn) $Fe_2O_4$ (manganese zinc ferrite) layer, a second layer 12 comprised of an $Al_2O_3$ layer, and a third layer 13 comprised of a Co—Cr—Pt layer are stacked on one another in this order. The MgO substrate has a vicinal surface, and (Mn, Zn) $Fe_2O_4$ is allowed to undergo epitaxial growth on the MgO substrate to form a (Mn, Zn) $Fe_2O_4$ layer having ordered step arrangement in the surface thereof. Co—Cr—Pt is a material having a high coercive force well known as a magnetic recording medium. The magnetization direction of the Co—Cr—Pt layer is fixed in a predetermined direction by its coercive force. The external electric field applied to the $Al_2O_3/(Mn, Zn)$ $Fe_2O_4$ interface drives only the magnetization of the (Mn, Zn) $Fe_2O_4$ layer.

The above construction has a feature such that the magnetization driven (referred to as "driven layer") is not in contact with the fixed magnetization (referred to as "fixed layer") of Co—Cr—Pt, but it is affected by the magnetic field for the magnetization of the fixed layer (magneto-static interaction). That is, there is a tendency that the magnetization of the driven layer is stable when it points in a direction opposite to the direction of the magnetization of the fixed layer due to attraction between the N pole and the S pole.

By utilizing the above magneto-static interaction, for example, the following operation can be realized. First, a design is presumed that the magnetization of the driven layer points in the x direction when applying an electric field in the +z direction, whereas it points in the y direction when applying an electric field in the −z direction. This design can be applied to the design for the step arrangement at an interface. However, it is not known as to which direction the magnetization points when no external electric field is applied. In this case, by fixing the magnetization of the fixed layer in the (x, y, z)=(−1, −1, 0) direction, when the magnetization of the driven layer is not forced to point in the x direction or y direction by the external electric field, the magnetization of the driven layer is stable due to magneto-static interaction in the (x, y, z)=(1, 1, 0) direction which is not parallel to the fixed layer. Thus, it is possible to achieve driving of magnetization in which the magnetization in a neutral state where it points in a direction at an angle of 45° to each of the x axis and the y axis is rotated at 45° in the clockwise direction or counterclockwise direction depending on the polarity only when applying an electric field. The movement of magnetization to the both sides from a neutral point is suitable for application to a photomagnetic modulator and the like.

Next, the second embodiment having a multilayer structure which contains two magnetic layers is described with reference to the diagrammatic cross-sectional view of FIG. 20.

Figure 20:
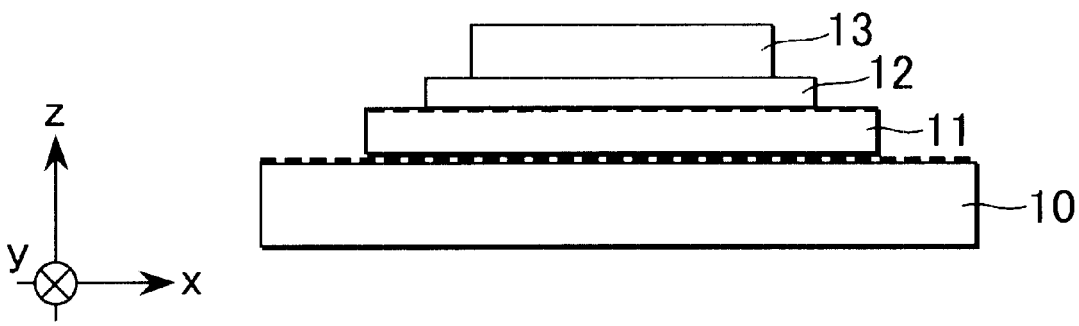
FIG. 20 is a diagrammatic cross-sectional view showing the second embodiment having a multilayer structure which contains two magnetic layers.

As shown in FIG. 20, on a substrate 10 comprised of a MgO substrate, a first layer 11 comprised of an $Fe_3O_4$ (ferrite) layer, a second layer 12 comprised of a NiO layer, and a third layer 13 comprised of a Cu layer are stacked on one another in this order. $Fe_3O_4$ is a ferrimagnetic material having magnetization and having a resistivity as small as $10^{-2}$ Ωcm, and the magnetization receives an action of driving. NiO is an antiferromagnetic material, which itself does not exhibit magnetization but has magnetic order in the crystal. The MgO substrate has a vicinal surface, and $Fe_3O_4$ is allowed to undergo epitaxial growth on the MgO substrate to form an $Fe_3O_4$ layer having ordered step arrangement in the surface thereof. In addition, both the NiO layer and the $Fe_3O_4$ layer are formed by epitaxial growth, and therefore, an excellent interface can be obtained.

Thus, in a structure such that two magnetic layers are in contact with each other, an exchange interaction occurs between the two magnetic layers through the interface to cause an interlayer coupling in which one layer restrains the magnetization or spin configuration of another layer.

Therefore, as an effect of the external electric field, not only an effect of modulation of the interface magnetic anisotropy but also an effect of modulation of the interlayer exchange interaction can be utilized.

Next, the third embodiment having a multilayer structure which contains two magnetic layers is described with reference to the diagrammatic cross-sectional view of FIG. 21.

Figure 21:
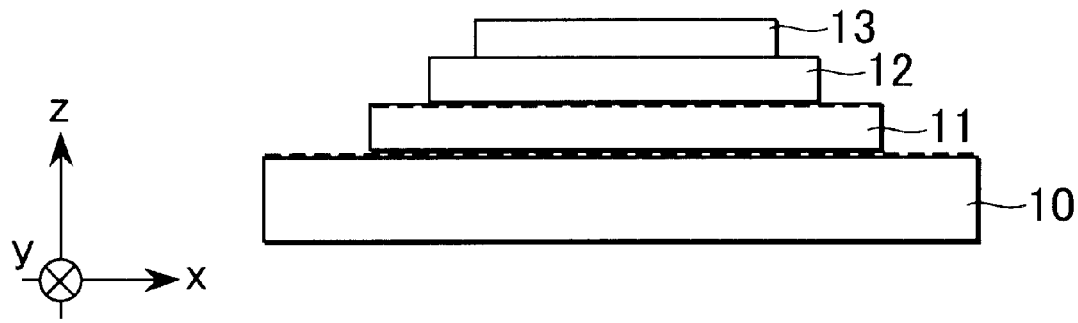
FIG. 21 is a diagrammatic cross-sectional view showing the third embodiment having a multilayer structure which contains two magnetic layers.

As shown in FIG. 21, on a substrate 10 comprised of a MgO substrate, a first layer 11 comprised of an $Fe_3O_4$ (ferrite) layer, a second layer 12 comprised of a $CoFe_2O_4$ layer, and a third layer 13 comprised of a Cu layer are stacked on one another in this order. Two types of magnetic layers exhibiting magnetization and having different resistivities, i.e., the $CoFe_2O_4$ layer and the $Fe_3O_4$ layer are in contact with each other. The $CoFe_2O_4$ layer and the $Fe_3O_4$ layer have the same spinel crystal structure, and are capable of undergoing epitaxial growth, and thus they are suitable for obtaining an excellent interface. The magnetization of the $CoFe_2O_4$ layer having a large crystal magnetic anisotropy is substantially fixed, and the $Fe_3O_4$ layer having a smaller crystal magnetic anisotropy is a driven layer. Further, the MgO substrate has a vicinal surface, and $Fe_3O_4$ is allowed to undergo epitaxial growth on the MgO substrate to form an $Fe_3O_4$ layer having ordered step arrangement in the surface thereof.

In this structure, changing of the interlayer coupling between the magnetic layers by an external electric field can be expected. However, when the interlayer ferromagnetic coupling is too strong (that is, the directions of the magnetization of the both layers are always parallel to each other), the effect of the external electric field is not reflected to the driving of magnetization. For rendering this coupling weak to adjust it to an appropriate strength, the nonmagnetic atoms described above with reference to FIG. 10 are disposed on the $CoFe_2O_4/Fe_3O_4$ interface in an amount corresponding to a 0.8 or less atomic layer. This corresponds to an example in which nonmagnetic atoms are disposed in a 0.8 or less atomic layer on the surface of the magnetic layer or the surface of a thin film facing the surface of the magnetic layer. The nonmagnetic atoms in a more than 0.8 atomic layer render the coupling too weak. Examples of nonmagnetic atoms include Al, Zn, Ti, Cu, Si, B, and O, and the nonmagnetic atoms can be selected from these.

Next, the forth embodiment having a multilayer structure which contains two magnetic layers is described with reference to the diagrammatic cross-sectional view of FIG. 22.

Figure 22:
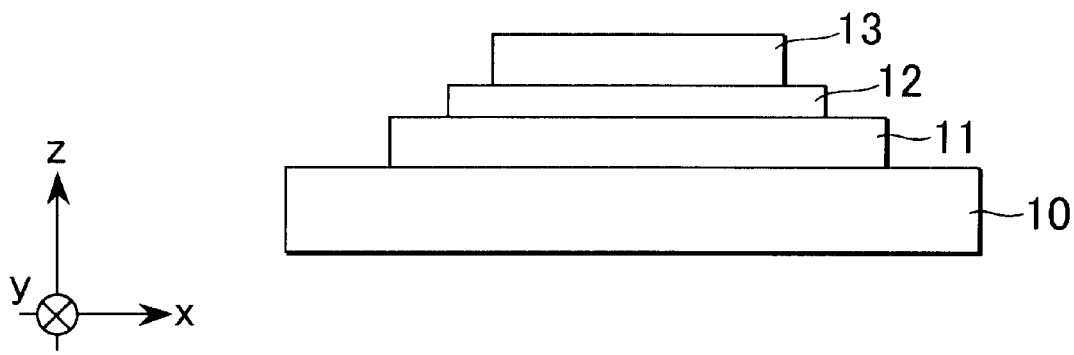
FIG. 22 is a diagrammatic cross-sectional view showing the forth embodiment having a multilayer structure which contains two magnetic layers.

As shown in FIG. 22, on a substrate 10 comprised of a GaAs substrate, a first layer 11 comprised of a (Ga, Mn) As layer, a second layer 12 comprised of a $NiFe_2O_4$ layer, and a third layer 13 comprised of a Cu layer are stacked on one another in this order. This is one example of a construction such that Mn-substituted GaAs is used as a magnetic semiconductor and is connected to a different magnetic material, and at least one layer in the magnetic layers is comprised of a semiconductor or a magnetic semiconductor. In this example, the magnetization of the $NiFe_2O_4$ layer is substantially fixed, and the (Ga, Mn) As layer functions as a driven layer.

In addition to (Ga, Mn) As, as a magnetic semiconductor exhibiting a magnetic property at room temperature, for example, $CdMnGeP_2$ disclosed in Medvedkin, et. al., Jpn. J. Appl. Phys. 39 (2000), L949–L951 can be utilized.

Next, the fifth embodiment having a multilayer structure which contains two magnetic layers is described with reference to the diagrammatic cross-sectional view of FIG. 23.

Figure 23:
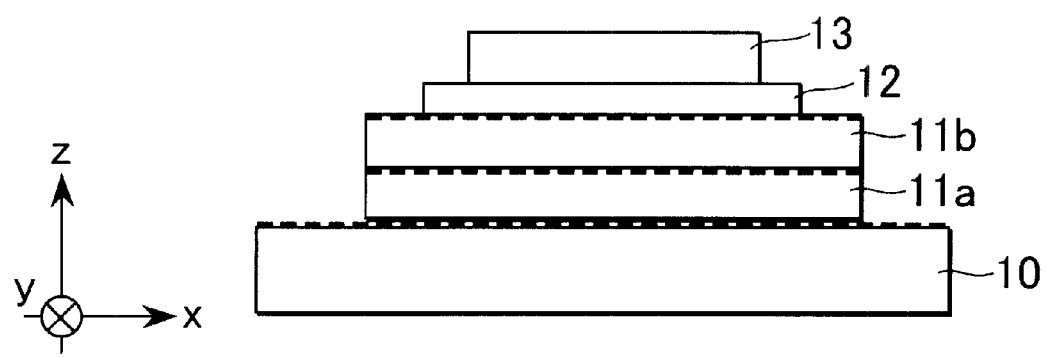
FIG. 23 is a diagrammatic cross-sectional view showing the fifth embodiment having a multilayer structure which contains two magnetic layers.

One form of a construction comprising {(Co/Pt)×5 layers}/NiO/$YBa_2Cu_3O_7$/$PrBa_2Cu_3O_7$/$SrTiO_3$ is shown in FIG. 23. Specifically, a construction is such that, on a substrate 10 comprised of a $SrTiO_3$ substrate, a first layer 11 comprised of a $PrBa_2Cu_3O_7$ layer 11a and an $YBa_2Cu_3O_7$ layer 11b, a second layer 12 comprised of a NiO layer, and a third layer 13 comprised of {(Co/Pt)×5 layers} are stacked on one another in this order. The term "(Co/Pt)×5 layers" indicates a laminated structure obtained by alternately stacking on one another a Co layer having a thickness of 0.4 nm and a Pt layer having a thickness of 0.6 nm in five cycles. The $SrTiO_3$ substrate has a vicinal surface, and $PrBa_2Cu_3O_7$ and then $YBa_2Cu_3O_7$ are allowed to undergo epitaxial growth on the $SrTiO_3$ substrate to form a $PrBa_2Cu_3O_7$ layer 11a and an $YBa_2Cu_3O_7$ layer 11b each having ordered step arrangement in the surface thereof. The {(Co/Pt)×5 layers} material is known as an example of a perpendicular magnetization film in which the easy direction of magnetization is perpendicular to the film surface. A perpendicular magnetization film can be used as an example of the laminated structure in the present embodiment. Further, in the first layer 11, a conductive oxide, such as $YBa_2Cu_3O_7$ layer/$PrBa_2Cu_3O_7$ layer, can be used as an electrode.

Next, the sixth embodiment having a multilayer structure which contains two magnetic layers is described with reference to the diagrammatic cross-sectional view of FIG. 24.

Figure 24:
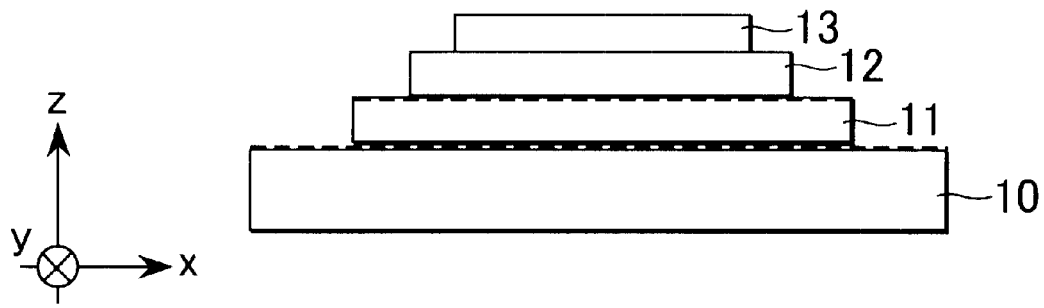
FIG. 24 is a diagrammatic cross-sectional view showing the sixth embodiment having a multilayer structure which contains two magnetic layers.

As shown in FIG. 24, a construction such that, on a substrate 10 comprised of a MgO substrate, a first layer 11 comprised of a $ZnFe_2O_4$ layer, a second layer 12 comprised of a $NiFe_2O_4$ layer, and a third layer 13 comprised of a $Co_{0.5}Fe_{2.5}O_4$ layer are stacked on one another in this order is used. The MgO substrate has a vicinal surface, and $ZnFe_2O_4$ is allowed to undergo epitaxial growth on the MgO substrate to form a $ZnFe_2O_4$ layer having ordered step arrangement in the surface thereof.

Next, the first embodiment having a multilayer structure which contains three magnetic layers is described with reference to the diagrammatic cross-sectional view of FIG. 25.

Figure 25:
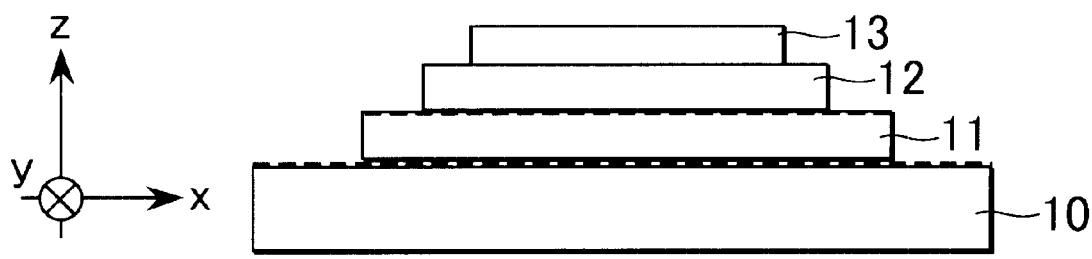
FIG. 25 is a diagrammatic cross-sectional view showing the first embodiment having a multilayer structure which contains three magnetic layers.

As shown in FIG. 25, a construction such that, on a substrate 10 comprised of a MgO substrate, a first layer 11 comprised of a Ni—Fe layer, a second layer 12 comprised of a NiO layer, and a third layer 13 comprised of a Co—Cr—Pt layer are stacked on one another in this order is used. The MgO substrate has a vicinal surface, and Ni—Fe is allowed to undergo epitaxial growth on the MgO substrate to form a Ni—Fe layer having ordered step arrangement in the surface thereof. In this construction, the Ni—Fe layer is a driven layer, and influenced by the Co—Cr—Pt layer having the fixed magnetization and undergoes interlayer coupling with the antiferromagnetic NiO layer.

Next, the second embodiment having a multilayer structure which contains three magnetic layers is described with reference to the diagrammatic cross-sectional view of FIG. 26.

Figure 26:
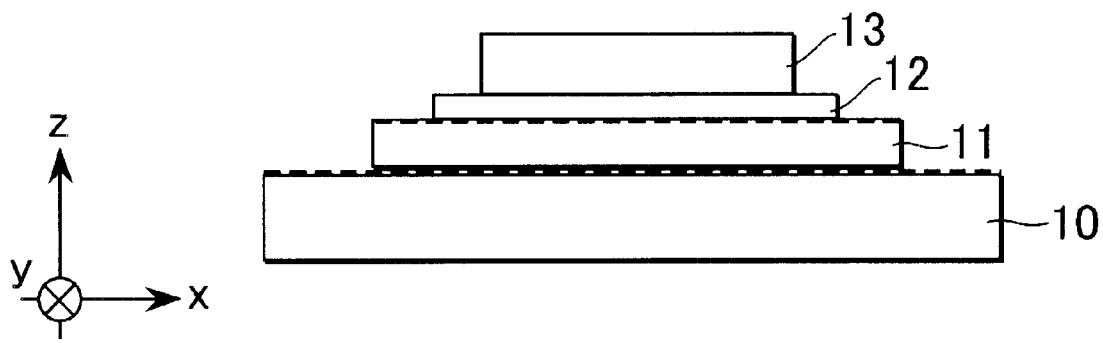
FIG. 26 is a diagrammatic cross-sectional view showing the second embodiment having a multilayer structure which contains three magnetic layers.

As shown in FIG. 26, a construction such that, on a substrate 10 comprised of a MgO substrate, a first layer 11 comprised of a $CoFe_2O_4$ layer, a second layer 12 comprised of a $NiFe_2O_4$ layer, and a third layer 13 comprised of {(Co/Pt)×5 layers} are stacked on one another in this order is used. The term "(Co/Pt)×5 layers" indicates a laminated structure obtained by alternately stacking on one another a Co layer having a thickness of 0.4 nm and a Pt layer having a thickness of 0.6 nm in five cycles, and is known as an example of a perpendicular magnetization film in which the easy direction of magnetization is perpendicular to the film surface. In the above example of a construction, the $NiFe_2O_4$ layer having the smallest magnetic anisotropy of the three layers is a driven layer, and operates depending on the changing of the balance of influence from the magnetic layers on both sides.

Next, an embodiment of a multilayer structure in which a magnetic layer achieves driving of magnetization reaching to 180° or more is described with reference to the diagrammatic views of FIGS. 27(1) and 27(2) (cross-section).

Figure 27:
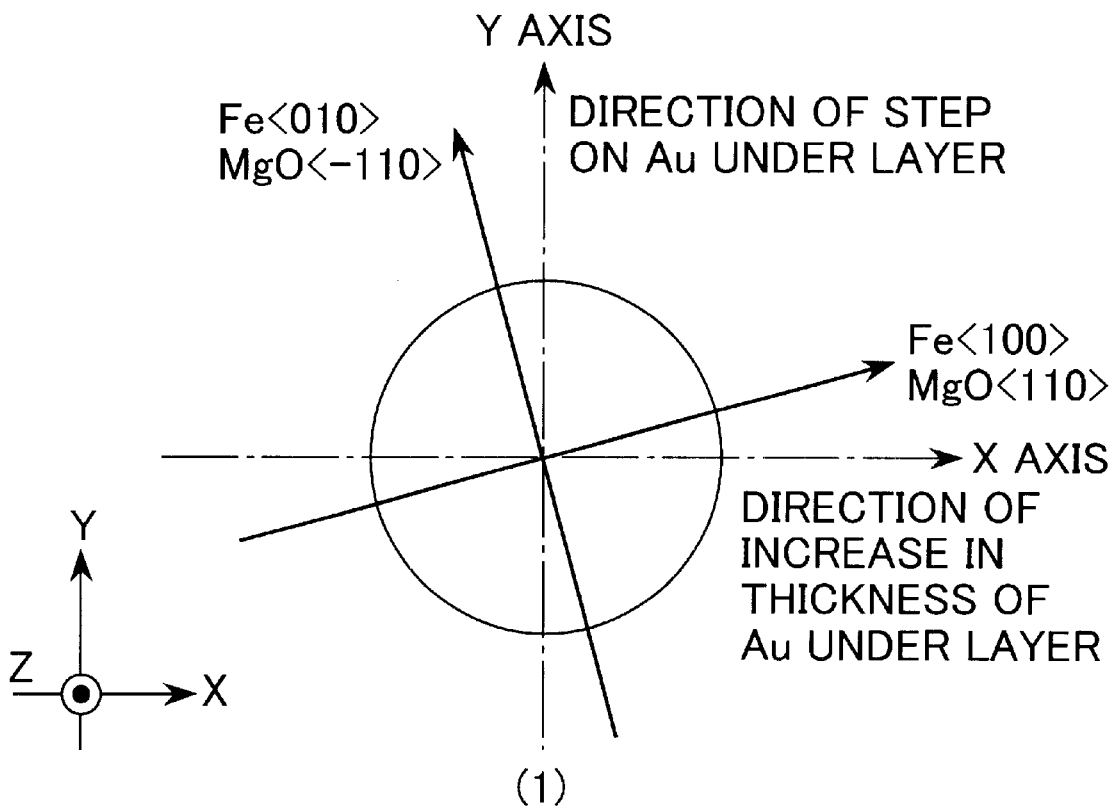
FIGS. 27(1) and 27(2) are explanatory views showing an example which achieves driving of magnetization at 180° or more.
Figure 27:
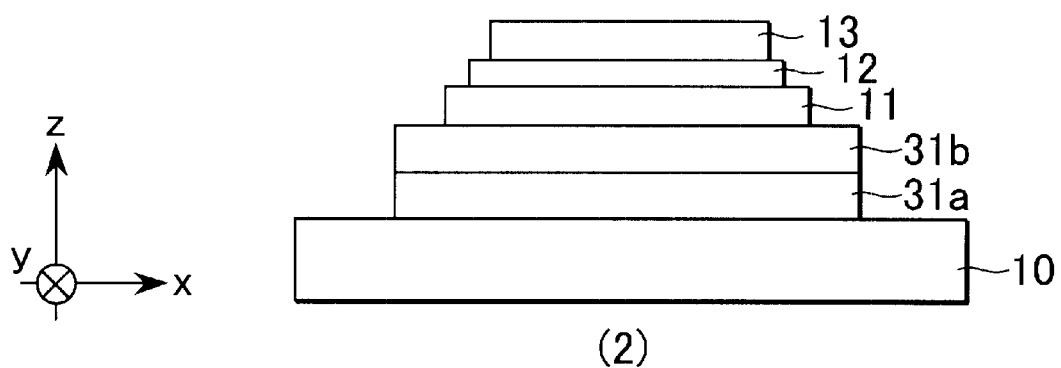

As shown in FIG. 27(2), following layers are stacked in the appearing order on a MgO substrate 10; a Ag layer 31a, a Au layer 31b, the first layer 11 comprised of Fe, the second layer 12 comprised of MgO, and the third layer 13 comprised of Pt.

In this multi-layer structure, the Fe layer is the only one magnetic layer with its magnetization vector driven by the voltage-induced effect. The geometrical configuration of the relevant crystal axes illustrated in FIG. 27(1) is essential to achieve a full magnetization reversal reaching to 180°.

The above construction corresponds to a construction in which the magnetic layer has properties: that the magnetic layer has configuration of four-time symmetry easy axis of magnetization in a state where no external voltage is applied wherein easy axes of magnetization in the plane of the magnetic layer cross at an angle of 90°; that an angle between the direction of the easy axis of magnetization by uniaxial magnetic anisotropy caused when an external voltage is applied and the direction of each of the easy axes of magnetization in the configuration of four-time symmetry easy axis of magnetization is 5° to 30°; and that the direction of the easy axis of magnetization by uniaxial magnetic anisotropy caused when an external voltage is applied is selected from two directions which are different from each other at about 90° by changing the polarity of the voltage, the absolute value of the voltage, or the interface on which an electric field is generated in the method of applying the external voltage.

Further, as shown in FIG. 27(1), the MgO (001) substrate is disposed in a direction such that an angle between the <110> and <−110> directions of the MgO crystal and the x axis and the y axis, respectively, is 15°, and epitaxial growth for up to an Fe layer is conducted using under layers of a Au layer 31 and a Ag 31a to obtain the Fe layer in the direction shown in FIG. 27(1) in which the <100> direction of the Fe layer is parallel to the <110> direction of the MgO substrate.

When the Fe film is not affected by any extrinsic factor (the crystal magnetic anisotropy of Fe) from the outside, the directions of the easy axes of magnetization are determined by the magnetocrystalline anisotropy of the material, which become the Fe <100> and Fe <010> directions indicated by the arrows shown in FIG. 27(1).

The Au layer in contact with the lower surface of Fe is formed so that the thickness linearly increases in the x direction. For this reason, step arrangement extending in the y direction is present in the upper surface of the Au layer 31b and further the MgO/Fe interface. By virtue of the effect of this step arrangement, when the polarity of the voltage applied to the laminated structure is changed, an action of pointing the magnetization of the Fe layer in a direction parallel to or perpendicular to the direction of the step arrangement according to the polarity changed is effected.

In the initial state where no voltage is applied, the magnetic vector points in the Fe <100> direction close to the x direction. When a voltage having the polarity that forces the magnetization parallel to the atomic steps (that is, parallel to the y axis) is applied, the magnetization vector is rotated not toward −y direction but toward +y direction due to its inclination angle off from the x-axis in the initial state.

The magnetization vector relaxes in the Fe <010> direction close to the y-axis as the voltage is removed. Successively, when a voltage is applied with the polarity forcing the magnetization perpendicular to the atomic steps (that is, forcing magnetization parallel to the x axis), the magnetization vector is driven to rotate not toward +x but −x direction due to its inclination from the y-axis before the application of the voltage. Thus, by repeatedly applying driving forces with alternating polarity to render the magnetization in a direction parallel to the y axis or x axis, successive 90 degrees rotations of the magnetization vector (−y direction, +x direction, +y direction, . . . ) is achieved.

Thus, the direction of the magnetic vector can be moved at 180° or more, and, when no voltage is applied, the magnetization is stopped in any of the directions of easy axes of Fe, i.e., four directions, and hence, it is advantageously used as a tetranary memory apparatus.

Figure 28:
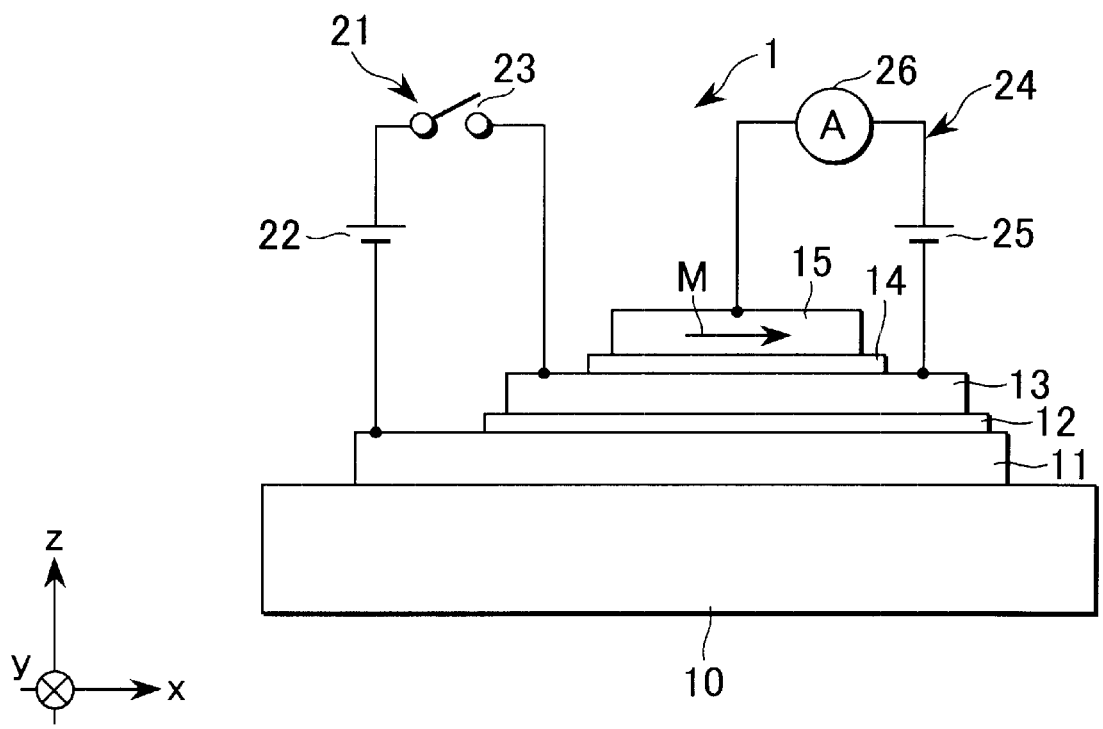
FIG. 28 is a diagrammatic view of the construction of a magnetically functioning apparatus which comprises a solid magnetic memory.

Next, an embodiment of a magnetic memory device is described with reference to the diagrammatic cross-sectional view of FIG. 28. FIG. 28 shows an example of the combination of a magnetic layer having the magnetization driven by the driving method in the present invention as a memory layer and a magnetic tunnel junction (MJT) for reading out.

As shown in FIG. 28, on a substrate 11, a first layer 11 comprised of a low-resistance layer, a second layer 12 comprised of a high-resistance layer, a third layer 13 comprised of a magnetic memory layer, a forth layer 14 comprised of an insulating layer, and a fifth layer 15 comprised of a fixed magnetic layer are stacked on one another in this order from the substrate 10. An external circuit 21 which functions as a writing circuit is connected to both the low-resistance layer and the magnetic memory layer. The external circuit 21 is constituted by a power source 22 and a switch 23, and the negative electrode in the power source 22 is connected to the first layer 11 as a low-resistance layer, and the positive electrode in the power source 22 is connected to the third layer 13 as a magnetic memory layer. Further, an external circuit 24 which function as a reading-out circuit is connected to both the third layer 13 as a magnetic memory layer and the fifth layer 15 as a fixed magnetic layer. The external circuit 24 is constituted by a power source 25 and an ammeter 26, and the negative electrode in the power source 25 is connected to the third layer 13 as a magnetic memory layer, and the positive electrode in the power source 25 is connected to the fifth layer 15 as a fixed magnetic layer.

In the above construction, three layers, i.e., the magnetic memory layer, the insulating layer, and the fixed magnetic layer constitute an MJT. The construction of the magnetically functioning apparatus (solid magnetic memory) 1 of the present invention can realize electric power savings, as compared to the conventional solid magnetic memory which writes using a magnetic field generated by a current.

Figure 29:
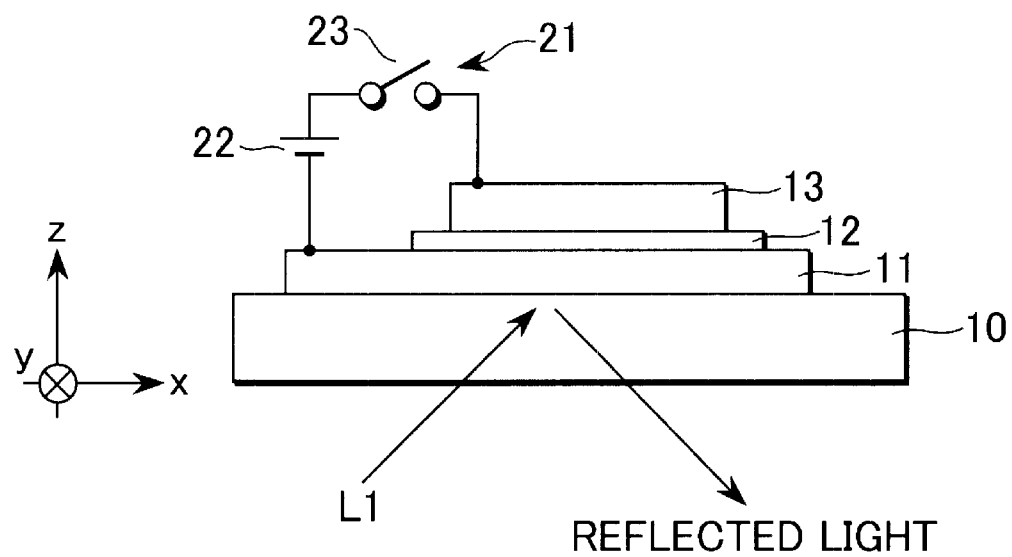
FIG. 29 is a diagrammatic view of the construction of a magnetically functioning apparatus which comprises a magneto-optical modulator.
Figure 30:
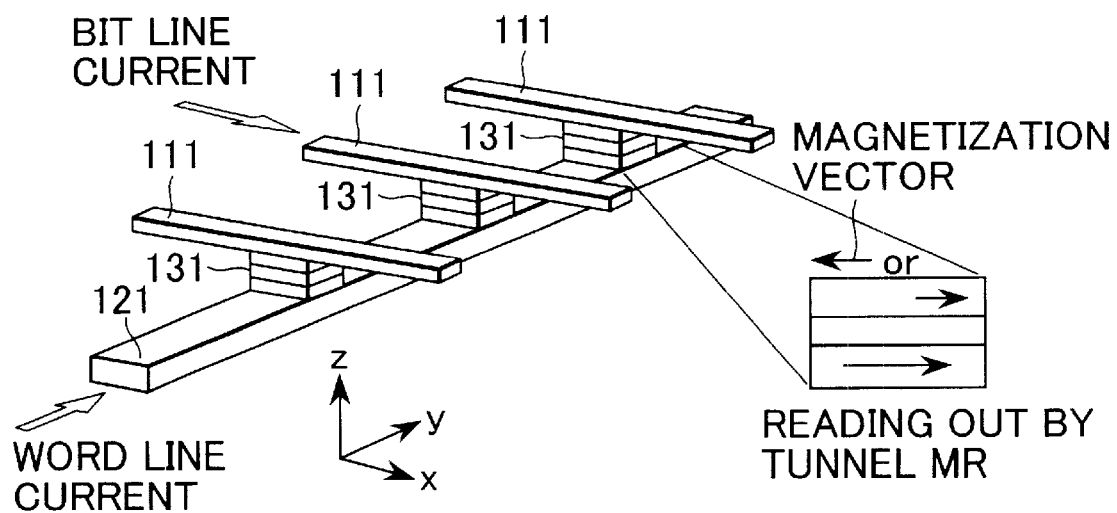
FIG. 30 is a diagrammatic view of the construction of an MRAM which is an example of driving of magnetization by a magnetic field generated by a current.
Figure 31:
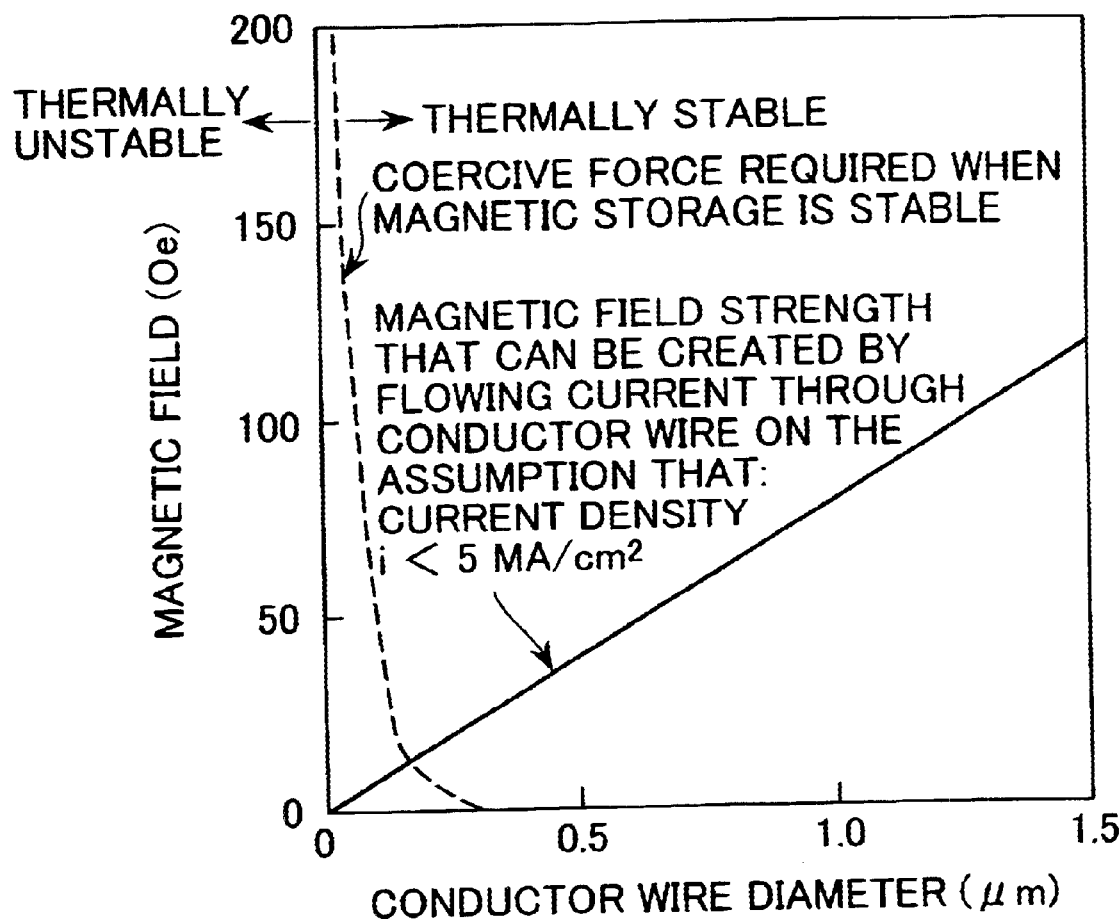
FIG. 31 is a graph showing the relationship between the magnetic field and the conductor wire diameter, which illustrates the relationship between the scale-down of a magnetically functioning apparatus and the driving force for inversion of magnetization.
Figure 32:
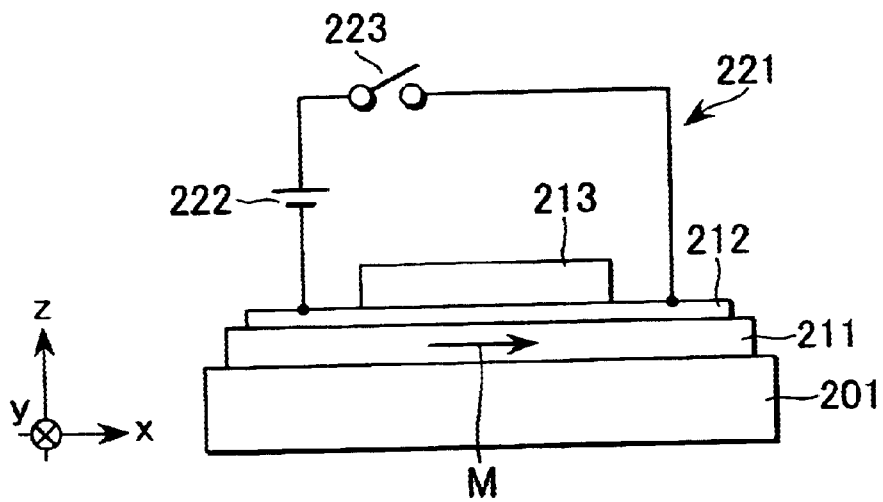
FIG. 32 is a diagrammatic view of the construction of a magnetically functioning apparatus which achieves driving of magnetization by using heat.
Figure 33:
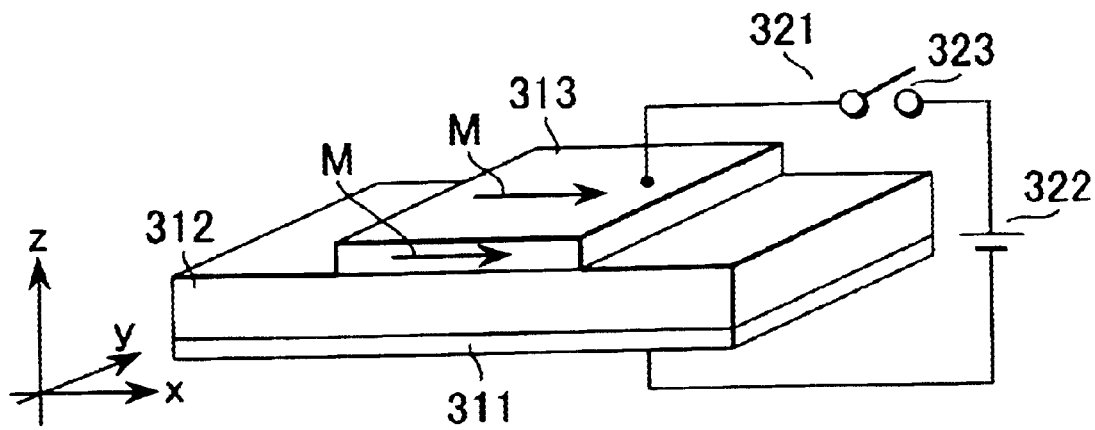
FIG. 33 is a diagrammatic perspective view of a magnetically functioning apparatus which achieves driving of magnetization by using a stress.
Figure 34:
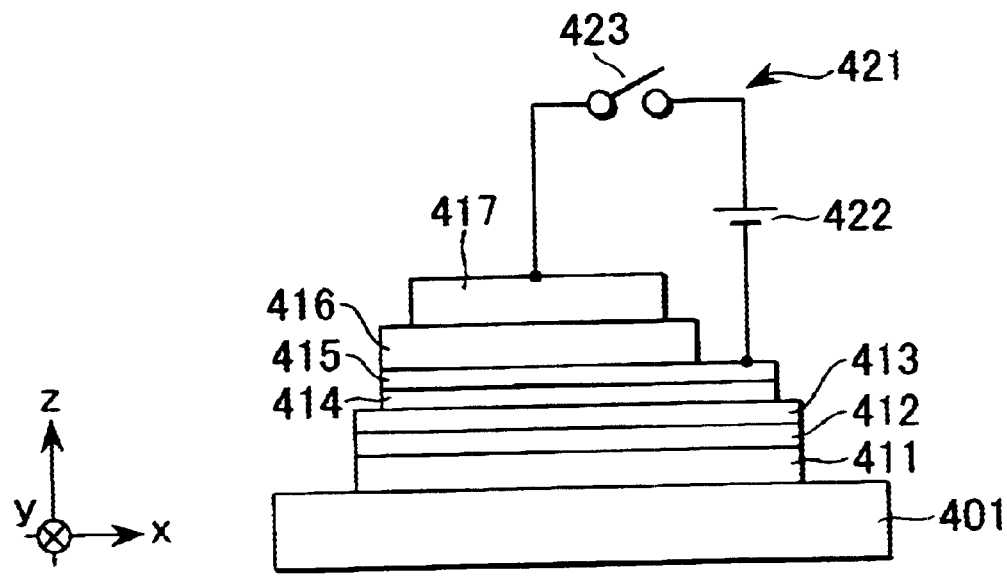
FIG. 34 is a diagrammatic view of the construction of a magnetically functioning apparatus which achieves driving of magnetization by using quantum interference.

Next, an embodiment of a magneto-optical modulator is described with reference to the diagrammatic cross-sectional view of FIG. 29. FIG. 29 shows an example of a magneto-optical modulator in which a magnetic layer having the magnetization driven by the driving method in the present invention is disposed at a position such that a light reflects off the magnetic layer through a transparent substrate.

As shown in FIG. 29, on a substrate 10 comprised of a transparent substrate, a first layer 11 comprised of a low-resistance magnetic layer, a second layer 12 comprised of a high-resistance layer, and a third layer 13 comprised of a low-resistance layer are stacked on one another in this order from the substrate 10. An external circuit 21 which functions as a driving circuit is connected to both the first layer 11 as a low-resistance magnetic layer and the third layer 13 as a low-resistance layer. The external circuit 21 is constituted by a power source 22 and a switch 23, and the negative electrode in the power source 22 is connected to the first layer 11 as a low-resistance magnetic layer, and the positive electrode in the power source 22 is connected to the third layer 13 as a low-resistance layer.

When a light L1 entering from the substrate 10 reflects off the first layer 11 which is a low-resistance magnetic layer, the plane of polarization is rotated and the ellipticity is changed by a magnetic Kerr effect, and this effect depends on the plane of polarization of the incident light and the direction of magnetization of the low-resistance magnetic layer. Therefore, in the above construction, by changing the direction of the magnetization of the low-resistance magnetic layer, modulation of the plane of polarization of the reflected light and the ellipticity can be achieved. This construction is excellent as magnetization modulation which can achieve electric power savings.

As mentioned above, when the magnetic anisotropy of a magnetic layer or the magnetic coupling between the magnetic layer and a different magnetic layer is changed due to influence of an electric field at an interface, the direction of the magnetization of the magnetic layer can be changed. In the magnetic characteristics modulation method of the present invention, by utilizing this effect, an operation of a magnetically functioning apparatus which performs magnetic writing without applying an external magnetic field, such as a magnetic memory, is enabled.

In addition, in the magnetically functioning apparatus of the present invention, by utilizing the effect that, when the magnetic anisotropy of a magnetic layer or the magnetic coupling between the magnetic layer and a different magnetic layer is changed due to influence of an electric field at an interface, the direction of the magnetization of the magnetic layer can be changed, a magnetically functioning apparatus which performs magnetic writing without applying an external magnetic field, such as a magnetic memory, can be constructed.

Although the present invention has been described in its preferred form with a certain degree of particularity, obviously many changes, combinations and variations are possible therein. It is therefore to be understood that the present invention may be practiced otherwise than as specifically described herein without departing from the scope of the present invention.

What is claimed is:

1. A method of modulating magnetic characteristics of a magnetic film that leads to a change of the magnetization state of said magnetic film, wherein:
    said magnetic film comprises a layer in a multi-layer structure consisting of a first layer, a second layer having a higher electrical resistivity than that of said first layer, and a third layer having a lower electrical resistivity than that of said second layer, wherein said first layer, said second layer, and said third layer are stacked on one another,
    wherein at least one layer selected from the group consisting of said first layer, said second layer, and said third layer is a magnetic layer comprised of a material exhibiting a magnetic ordering of microscopic magnetic moments,
    wherein said method changes the magnetization state of said magnetic thin film by utilizing an effect wherein a change in the magnetic anisotropy or magnetostriction of said magnetic layer or the magnetic coupling between said magnetic layer and the adjacent another magnetic layer occurs associated with a change in electronic state at the surface or the interface of said magnetic film induced by the voltage applied between said first layer and the third layer by means of an external circuit.

2. The method described in claim 1, wherein the surface of said magnetic layer or the surface of a thin film facing the surface of said magnetic layer is single crystal.

3. The method described in claim 2, wherein the surface of said single crystal has a regular array of atomic steps with almost constant period.

4. The method described in claim 3, wherein a single crystalline substrate with a vicinal surface is used to realize said regular array of atomic steps.

5. The method described in claim 3, wherein a wedge-shaped epitaxial thin film having a linear thickness variation along one direction is used to realize said regular array of atomic steps.

6. The method described in claim 3, wherein magnetic or nonmagnetic atoms are deposited along said atomic steps.

7. The method described in claim 1, wherein the surface of said magnetic layer or the surface of a thin film facing the surface of said magnetic layer has a periodic concavo-convex structure.

8. The method described in claim 1, wherein nonmagnetic atoms less than 0.8 atomic layer coverage are deposited on the surface of said magnetic layer or the surface of a thin film facing the surface of said magnetic layer.

9. A magnetically functioning apparatus that utilizes a change of magnetization state of a magnetic film included in the apparatus, wherein:
    said magnetic film constitutes a layer in a multi-layer structure comprising a first layer, a second layer having a higher electrical resistivity than that of said first layer, and a third layer having a lower electrical resistivity than that of said second layer, wherein said first layer, said second layer, and said third layer are stacked on one another,
    wherein at least one layer selected from the group consisting of said first layer, said second layer, and said third layer is a magnetic layer comprised of a material exhibiting a magnetic ordering of microscopic magnetic moments,
    wherein the apparatus forces the magnetization state of the magnetic thin film to change utilizing an effect wherein a change in magnetic anisotropy or magnetostriction of said magnetic layer or the magnetic coupling between said magnetic layer and the adjacent another magnetic layer occurs associated with a change in electronic state at the surface or the interface of said magnetic film induced by the voltage applied between said first layer and the third layer by means of an external circuit.

10. The apparatus described in claim 9, wherein the surface of said magnetic layer or the surface of a thin film facing the surface of said magnetic layer is single crystal.

11. The apparatus described in claim 9, wherein the surface of said single crystal has a regular array of atomic steps with almost constant period.

12. The apparatus described in claim 11, wherein a single crystalline substrate with a vicinal surface is used to realize said regular array of atomic steps.

13. The apparatus described in claim 11, wherein a wedge shaped epitaxial thin film having a linear thickness variation along one direction is used to realize the regular array of atomic steps.

14. The apparatus described in claim 11, wherein magnetic or nonmagnetic atoms are deposited along said atomic steps.

15. The apparatus described in claim 9, wherein the surface of said magnetic layer or the surface of a thin film facing the surface of said magnetic layer has a periodic concavo-convex structure.

16. The apparatus described in claim 9, wherein nonmagnetic atoms less than 0.8 atomic layer coverage are deposited on the surface of said magnetic layer or the surface of a thin film facing the surface of said magnetic layer.

17. The apparatus described in one of the claims 9–16, wherein said magnetic layer is magnetically coupled to an auxiliary magnetic layer which is additionally prepared besides the three-layer structure described in claims 9–16.

18. The apparatus described in one of the claims 9–16, wherein said magnetic layer has the following properties:

said magnetic layer has a four-fold in-plane magnetic anisotropy with easy axes of magnetization crossing each other at an angle of 90° in a state where no external voltage is applied to the said multi-layer structure;

that the easy axis of a uniaxial magnetic anisotropy induced in the said magnetic layer by an externally applied voltage lies in a direction in the film plane at an angle between 5° and 30° from the aforementioned easy axes of the four-fold magnetic anisotropy; and that the direction of the easy axis of magnetization of the aforementioned uniaxial magnetic anisotropy induced by an external voltage is switched between either of two directions which are different from each other at subtantially 90° when either of the polarity of the voltage, the absolute value of the voltage, or the interface on which an electric field is generated is changed by the method of applying the external voltage.

19. The apparatus described in one of claims 9–16, wherein said magnetic layer receives driving forces on magnetization both on its top surface and bottom surface.

20. The apparatus described in one of the claims 9–16, wherein said magnetic layer is in contact with an antiferromagnetic film.

21. The apparatus described in one of the claims 9–16, wherein said magnetic layer or at least one layer in said magnetic layers is a semiconductor or a magnetic semiconductor.

* * * * *